(12) United States Patent
Nakai

(10) Patent No.: US 8,353,442 B2
(45) Date of Patent: Jan. 15, 2013

(54) SUPPORT DEVICE FOR RESONATOR

(75) Inventor: Seiya Nakai, Chikushi-gun (JP)

(73) Assignee: Adwelds Corporation, Fukuoka (JP)

( * ) Notice: Subject to any disclaimer, the term of this patent is extended or adjusted under 35 U.S.C. 154(b) by 0 days.

(21) Appl. No.: 12/935,865

(22) PCT Filed: Apr. 6, 2009

(86) PCT No.: PCT/JP2009/057068
§ 371 (c)(1),
(2), (4) Date: Sep. 30, 2010

(87) PCT Pub. No.: WO2009/125748
PCT Pub. Date: Oct. 15, 2009

(65) Prior Publication Data
US 2011/0036897 A1 Feb. 17, 2011

(30) Foreign Application Priority Data

Apr. 7, 2008 (JP) .................................. 2008-099390
Aug. 29, 2008 (JP) ................................ 2008-220890

(51) Int. Cl.
B23K 1/06 (2006.01)
B29C 65/08 (2006.01)
(52) U.S. Cl. ....................................... 228/1.1; 156/580.1
(58) Field of Classification Search .......................... None
See application file for complete search history.

(56) References Cited

U.S. PATENT DOCUMENTS 3,845,332 A * 10/1974 Last .............................. 310/325
4,779,020 A * 10/1988 Konno et al. ................. 310/325
6,109,502 A    8/2000 Sato
7,508,115 B2   3/2009 Kawada et al.
2004/0066583 A1* 4/2004 MacLeod ................... 360/265.9
2007/0045384 A1* 3/2007 McCrink et al. ............. 228/101
2007/0144680 A1   6/2007 Kawada et al.
2008/0203136 A1* 8/2008 Seyama ......................... 228/1.1
2010/0216262 A1* 8/2010 Harada ............................ 438/16

FOREIGN PATENT DOCUMENTS

| JP | 2583398 | 11/1996 |
| JP | 10-290911 A | * 11/1998 |
| JP | 11-265914 | 9/1999 |
| JP | 11-314168 | 11/1999 |
| JP | 2002-067162 | 3/2002 |
| JP | 2002-118152 | 4/2002 |
| JP | 2002-222834 | 8/2002 |
| JP | 2002-343831 | 11/2002 |
| JP | 2005-138181 | 6/2005 |
| JP | 2006-238677 | 9/2006 |
| JP | 2007-180332 | 7/2007 |

* cited by examiner

Primary Examiner — Kiley Stoner

(74) Attorney, Agent, or Firm — Jordan and Hamburg LLP

(57) ABSTRACT

The purpose of this invention is to provide a support device for a resonator that can support the resonator at an optional location, can let the resonator vibrate with a specified vibration consistently, and can apply an ultrasonic vibration to objects efficiently. By inserting first clamping means and second clamping means, which comprise supporting member at least at each contacting portion, into first portion-to-be-supported and second portion-to-be-supported of resonator, the resonator is supported. As substances of the supporting member, substances that have a logarithmic decrement higher than 0.01 and lower than 1.0 and/or a sound propagation speed of more than 5900 m/s are suitable.

24 Claims, 17 Drawing Sheets

F I G. 6
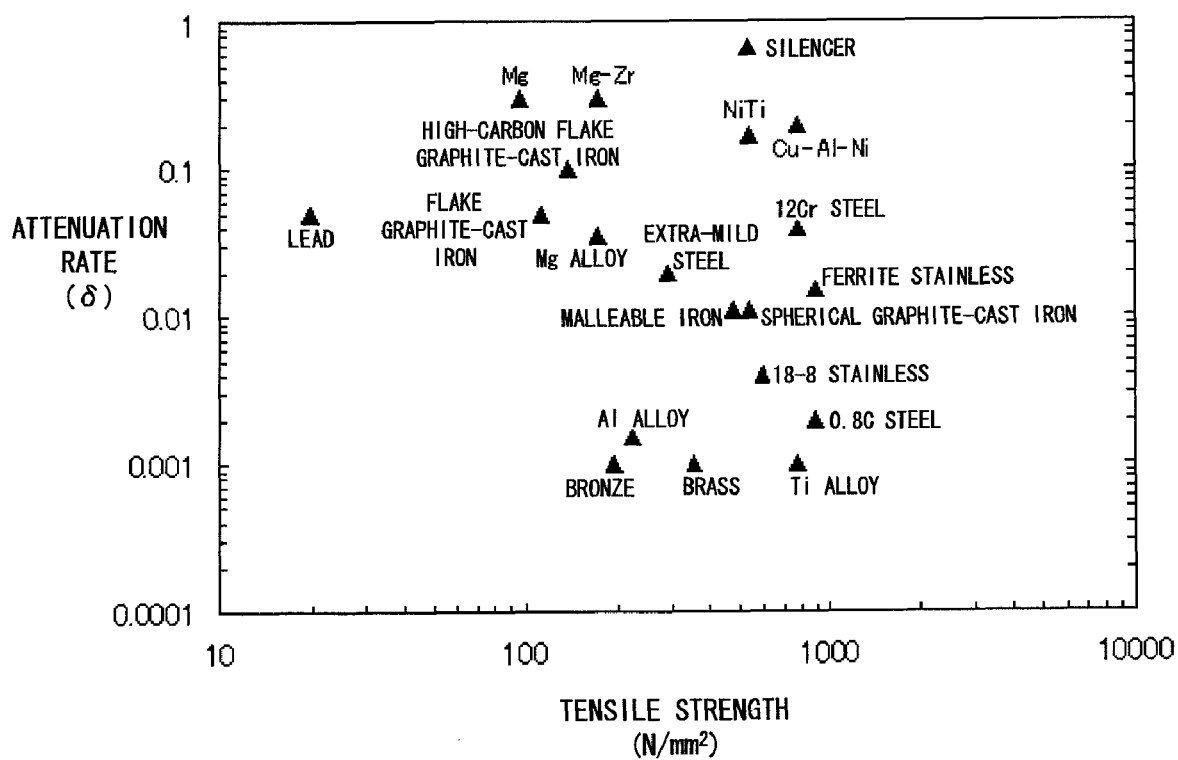

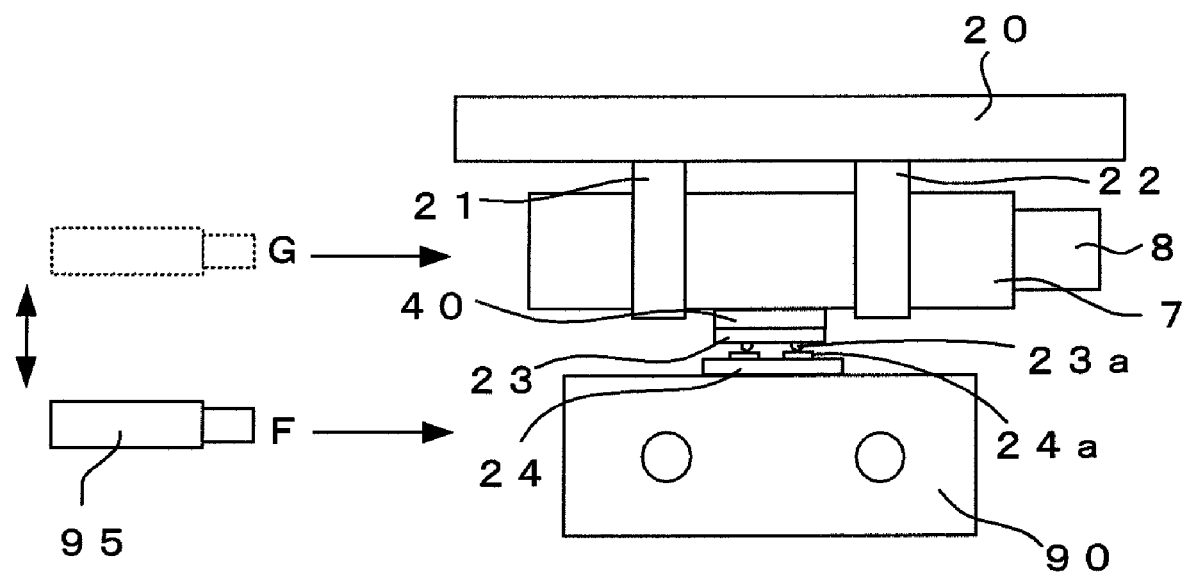
F I G. 1 0

F I G. 1 1
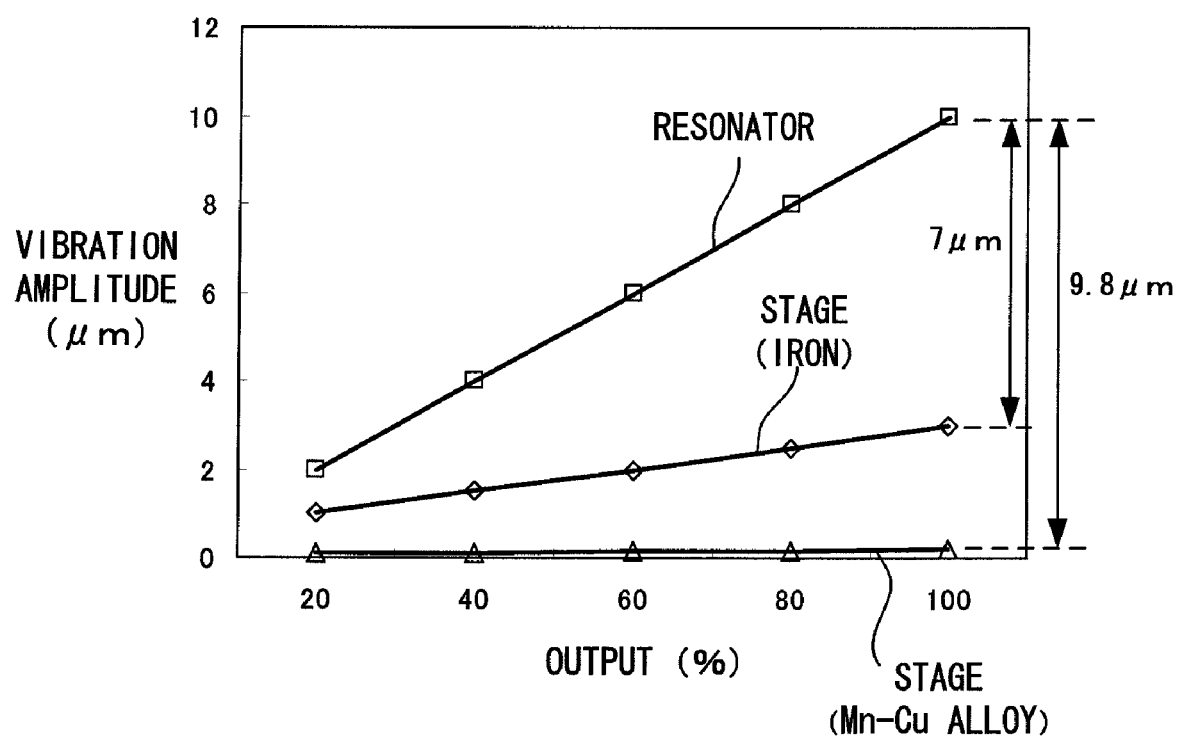

SUPPORT DEVICE FOR RESONATOR

BACKGROUND OF THE INVENTION

The present invention relates to a support device for resonator, which supports a resonator resonating by ultrasonic vibration of a transducer.

Conventionally, there are technologies to process objects by utilizing ultrasonic vibration, such as an ultrasonic vibration bonding device that bonds multiple objects by providing ultrasonic vibration to these objects which are placed on top of each other, using an ultrasonic cutting device that cuts objects by providing ultrasonic vibration on cutting devices, using an ultrasonic grinding device to grind objects by providing ultrasonic vibration on grinding devices, etc.

These apparatus, which utilize ultrasonic vibration, generally have resonators with transducers, and these transducers provide vibrations that are adjusted to the natural vibration frequencies of each resonator, then the vibration are amplified by the resonators, and the ultrasonic vibrations are applied to objects effectively.

But, as resonators vibrate together with supporting members, their natural vibration frequencies are changed easily by supporting members and by the supporting methods. Accordingly, there is a possibility, caused by supporting members and/or supporting methods, that a resonator would create unexpected frequencies much different from its own natural vibration frequency, and would not vibrate at a specified frequency. In addition, there is another problem in which abnormal vibration in directions that are different from the resonator's own vibrating direction, making it hard to effectively transfer the ultrasonic vibration to objects. Therefore, various technical improvements have been developed to support a resonator to let a resonator vibrate at a specified vibration frequency steadily.

For example, the resonator in the ultrasonic vibration bonding device described in JP No. 2583398B (Paragraphs [0018], [0019], [0021], [0022], [0024], FIG. 2, FIG. 3), features a protruding area with a convex shape at the minimum vibration amplitude point (nodal point) located on the peripheral surface of the resonator. Here, the nodal point is a node of the constant wave occurring on the resonator, and it is the point where expansion or constriction toward the center axis of the resonator, which is the direction of vibration transfer, does not take place. Then, by clamping the convex point with support members and tightly clamping those members mechanically, the device applies the specified ultrasonic vibration to the object and conducts bonding.

Also, as described in JP No. 1999-265914A (Paragraphs [0017], [0022], [0023], FIG. 3), the resonator comprises a thin plate-type rib on the nodal point of its peripheral surface as the fixing point. Then, abnormal vibrations that have different directions of vibration compared to the vibration of the resonator are absorbed by the rib, which is supported, and the resonator applies the specified ultrasonic vibrations to the objects, conducts bonding.

SUMMARY OF INVENTION

In the case of the ultrasonic vibration bonding device described in JP No. 2583398B (Paragraphs [0018], [0019], [0021], [0022], [0024], FIG. 2, FIG. 3), as the peripheral surface of the resonator are directly clamped tight mechanically, this condition was the cause of vibration loss and/or other abnormal vibration. Also, because the resonator is clamped mechanically, friction between the convex portion of the resonator, the supporting members, and the clamping members tends to cause abrasion among them, and it was necessary to clean and/or exchange these members/materials frequently. Also, there was another problem in which as the friction generates heat, the convex portion of the resonator, the supporting members and the clamping members were fused together. Moreover, it was not easy to control abnormal vibration by moving the supporting point of the resonator.

Also, because the fixed portion of the resonator described in the JP No. 1999-265914A (Paragraphs [0017], [0022], [0023], FIG. 3) is composed of a thin plate-type rib, there was a problem that the rib was weak and it tends to break easily. Accordingly, it was not easy to fine-tune the supporting point while the transducer was vibrating. Also, there was a problem in that it was hard to support the resonator at an optional point other than the nodal point.

Therefore, the purpose of the present invention is to provide a support device for a resonator that is capable of supporting the resonator at any optional point, allows the resonator to create a specified vibration frequency steadily, and applies ultrasonic vibration to target materials effectively.

To solve the problems described above, the support device of the resonator of the present invention comprises such features as, a resonator which resonates with an ultrasonic vibration generated by a transducer, a portion-to-be-supported which is composed on a peripheral surface of the resonator, supporting means for supporting the resonator by engaging with the portion-to-be-supported so that the natural vibration frequency of the resonator is kept at the specified frequency, and that the above the supporting means is distinctive to include a supporting member that contains substances with $0.01<$logarithmic decrement$<1.0$, and the supporting member is located at the point where the supporting means contacts with the resonator.

Also, the support device of the resonator of the present invention comprises such features as, a resonator which resonates with an ultrasonic vibration that is generated by a transducer, a portion-to-be-supported which is composed on the peripheral surface of the resonator, supporting means for supporting the resonator by engaging with the portion-to-be-supported so that the natural vibration frequency of the resonator is kept at the specified frequency, and that above the supporting means is distinctive to include a supporting member that contains substances with sound propagation speed of more than 5900 m/s, and the supporting member is located at the point where the supporting means contacts with the resonator.

Also, the support device of the present invention is additionally equipped with a stage arranged below the resonator mentioned above to place an object to which an ultrasonic vibration is applied, and the stage includes a holding member that contains substances with $0.01<$logarithmic decrement$<1.0$, to prevent transferring vibration, at least on the surface of the stage where the object is placed.

Also, the support device of the present invention is additionally equipped with a stage arranged below the resonator mentioned above to place an object to which an ultrasonic vibration is applied, and the stage includes a holding member that contains substances with sound propagation speed of more than 5900 m/s, to prevent transferring vibration, at least on the surface of the stage where the object is placed.

Based on test results conducted by the present inventor, it has been confirmed that substances that have larger logarithmic decrement and/or faster sound propagation speed are suitable for the substances of the supporting member that support resonators. According to the test results, because substances with large logarithmic decrement are hard to transfer vibration, they absorb abnormal vibration from resonators swiftly, and when the logarithmic decrement of the substances are larger than 0.01 and smaller than 1.0, it is considered that they can control abnormal vibration from resonators effectively (refer to FIGS. 5, 6). Also, because substances that have large sound propagation speed have great speed to transfer vibration, they absorb abnormal vibration from resonators swiftly, and when the sound propagation speed of the substances are larger than 5900 m/s, it is considered that they can control abnormal vibration from resonators effectively (refer to FIGS. 5, 7).

Accordingly, the supporting means of the support device that is engaged with the portion-to-be-supported and supports the resonator comprises a supporting member which contains substances with 0.01<logarithmic decrement<1.0, the vibration absorbing speed is fast and abnormal vibration which have different directions than that of the resonator is absorbed by the supporting member at the contact point on the resonator, and it becomes possible to let the resonator vibrate at the specified frequency consistently. Accordingly, ultrasonic vibration is applied effectively to the object. Also, because the supporting point of the resonator is not limited to the nodal point and the supporting means is capable of supporting the resonator at any optional point, it is now possible to change the configuration of the device. Moreover, because it is possible to make the size of the supporting means smaller and/or to reduce the number of supporting means, the device can be made smaller and/or simpler.

Also, the supporting means of the support device that is engaged with the portion-to-be-supported and supports the resonator comprises a supporting member which contains substances with sound propagation speed of more than 5900 m/s, the vibration transferring speed is fast and abnormal vibration which have different directions than that of the resonator is diffused by the supporting member at the contact point on the resonator, and it becomes possible to let the resonator vibrate at the specified frequency consistently. Accordingly, ultrasonic vibration is applied effectively to the object. Also, because the supporting point of the resonator is not limited to the nodal point and the supporting means is capable of supporting the resonator at any optional point, it is now possible to change the configuration of the device. Moreover, because it is possible to make the size of the supporting means smaller and/or to reduce the number of supporting means, the device can be made smaller and/or simpler.

Also, because the stage where the objects are placed comprises a holding member to prevent the transfer of vibration that contains substances with 0.01<logarithmic decrement<1.0 at least on the surface where the object is placed, it is possible to make the resonator vibrate at a specified frequency consistently with the supporting member in the supporting means stated above, and the ultrasonic vibration which is transferred from the resonator to the stage through the object is absorbed swiftly by the holding member to prevent the transfer of vibration. Accordingly, by controlling the stage vibration, the relative vibration amplitude between the object held on the stage and the resonator or between the object held on the stage and the object held on the resonator becomes larger, and it becomes possible to transfer the ultrasonic vibration to the object effectively.

Also, because the stage where the objects are placed comprises a holding member to prevent the transfer of vibration that contain substances with sound propagation speed of more than 5,900 m/sec at least on the surface where the object is placed, it is possible to make the resonator vibrate at a specified vibration consistently with the supporting member in the supporting means stated above, and the ultrasonic vibration which is transferred from the resonator to the stage through the object is diffused swiftly by the holding member to prevent the transfer of vibration. Accordingly, by controlling the stage vibration, the relative vibration amplitude between the object held on the stage and the resonator or between the object held on the stage and the object held on the resonator becomes larger, and it becomes possible to transfer the ultrasonic vibration to the target material effectively.

BRIEF DESCRIPTION OF DRAWINGS

FIG. 3A is a frontal view, FIG. 3B is a cross section of A-A arrow line shown in FIG. 3A;

FIG. 6 is a graph illustrating a logarithmic decrement of each substance;

FIG. 8A is a frontal view, FIG. 8B is a partial cross section view;

FIG. 9A is a frontal view, FIG. 9B is a partial cross section view;

FIG. 10 is a partial schematic diagram illustrating a head section and a stage section of an ultrasonic vibration bonding device according to the third embodiment of the present invention;

FIG. 11 is a graph illustrating a result of measured vibration amplitudes of a resonator and a stage;

DETAILED DESCRIPTION OF THE INVENTION

The First Embodiment

Figure 1:
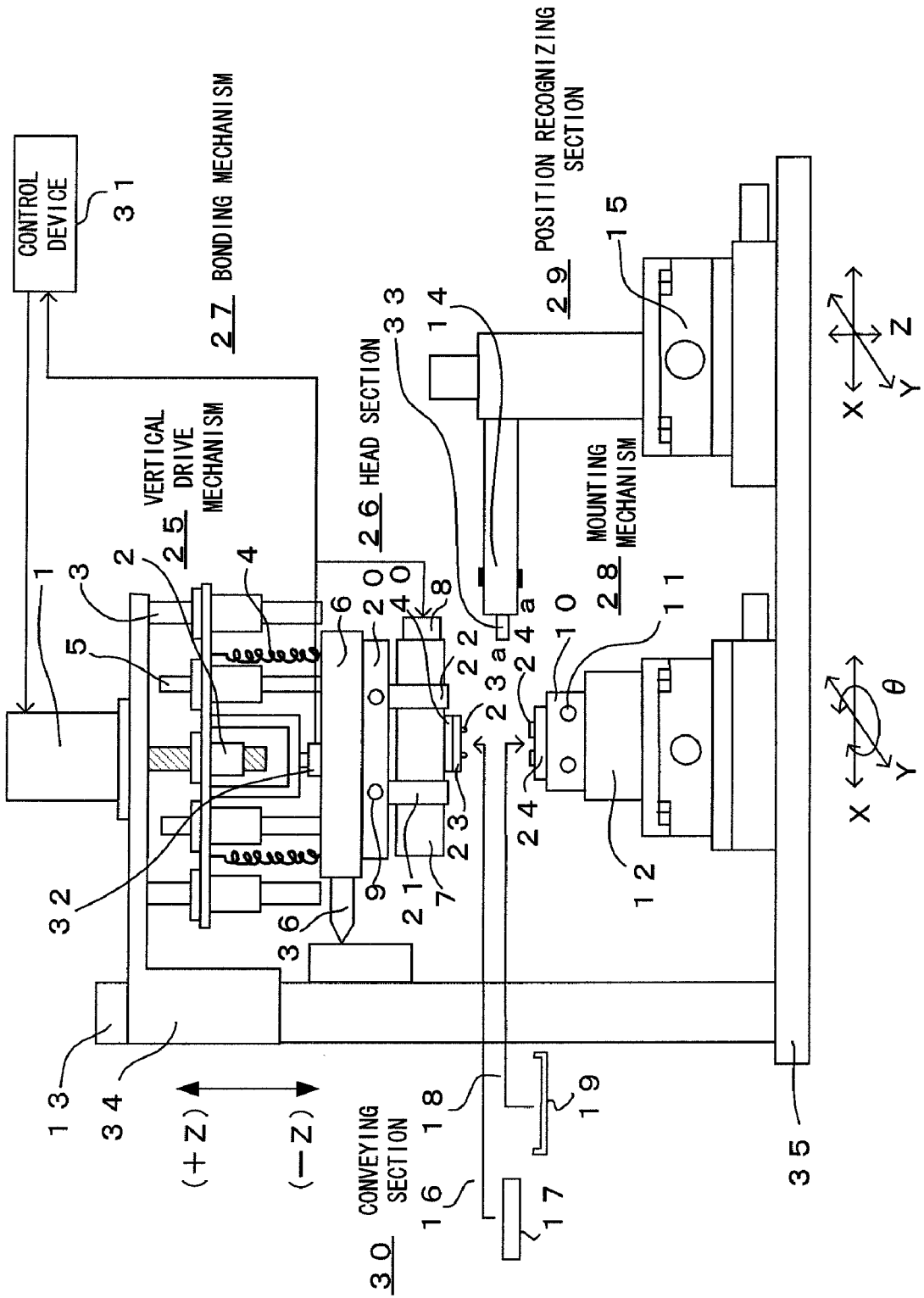
FIG. 1 is a schematic diagram illustrating a configuration of an ultrasonic vibration bonding device according to the first embodiment of the present invention.
Figure 2:
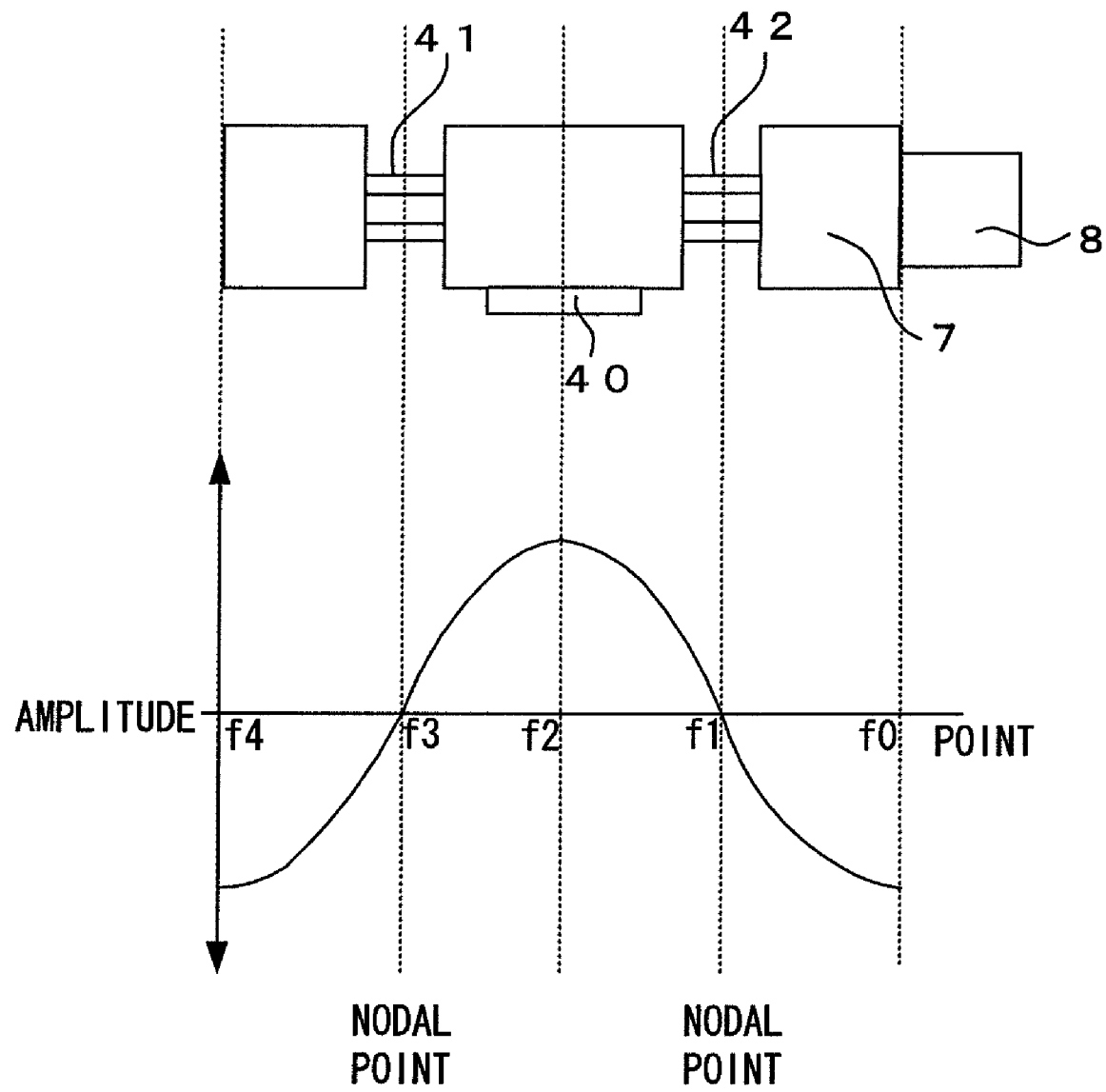
FIG. 2 is a schematic diagram illustrating the resonator according to the first embodiment.
Figure 3A:
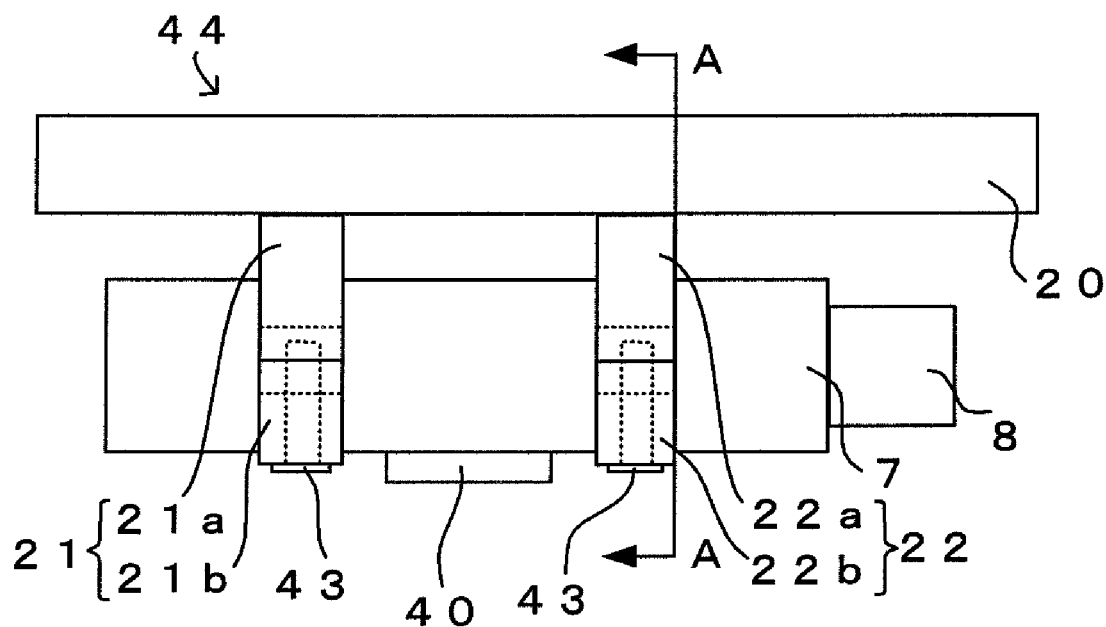
FIGS. 3A and 3B are a schematic diagram illustrating the resonator shown in FIG. 2 supported by a supporting means.
Figure 3B:
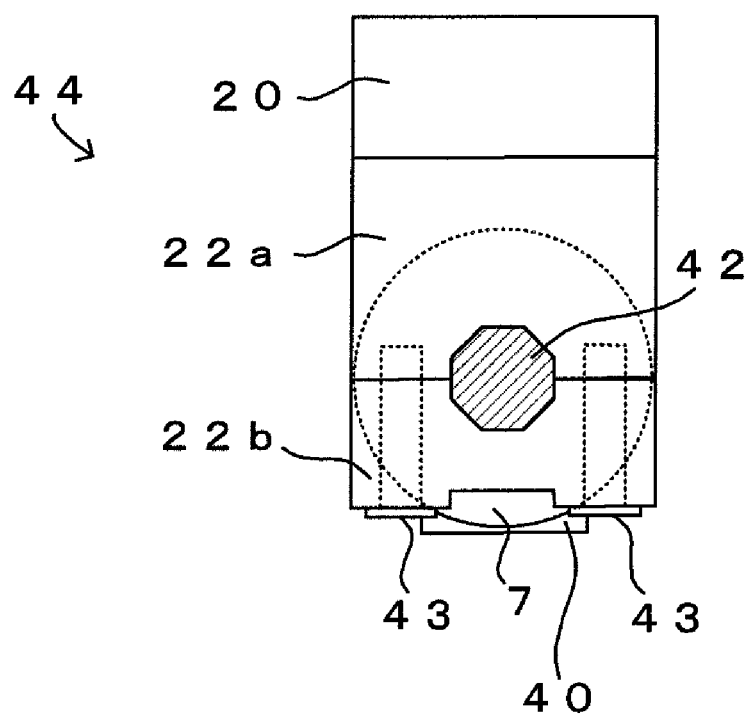
Figure 4:
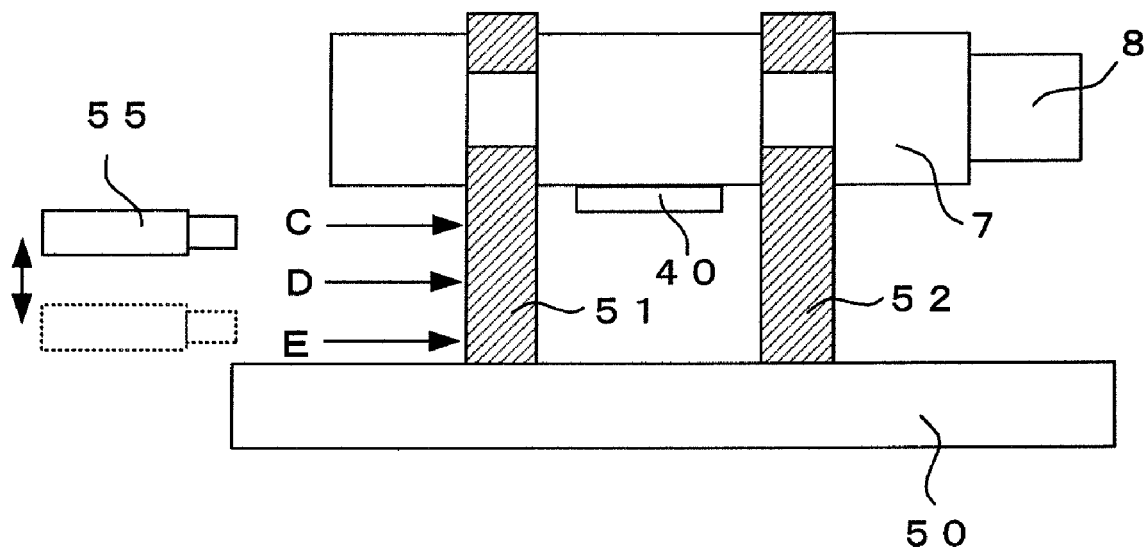
FIG. 4 is a schematic diagram illustrating an experimental device for measuring vibration amplitudes of the supporting means.
Figure 5:
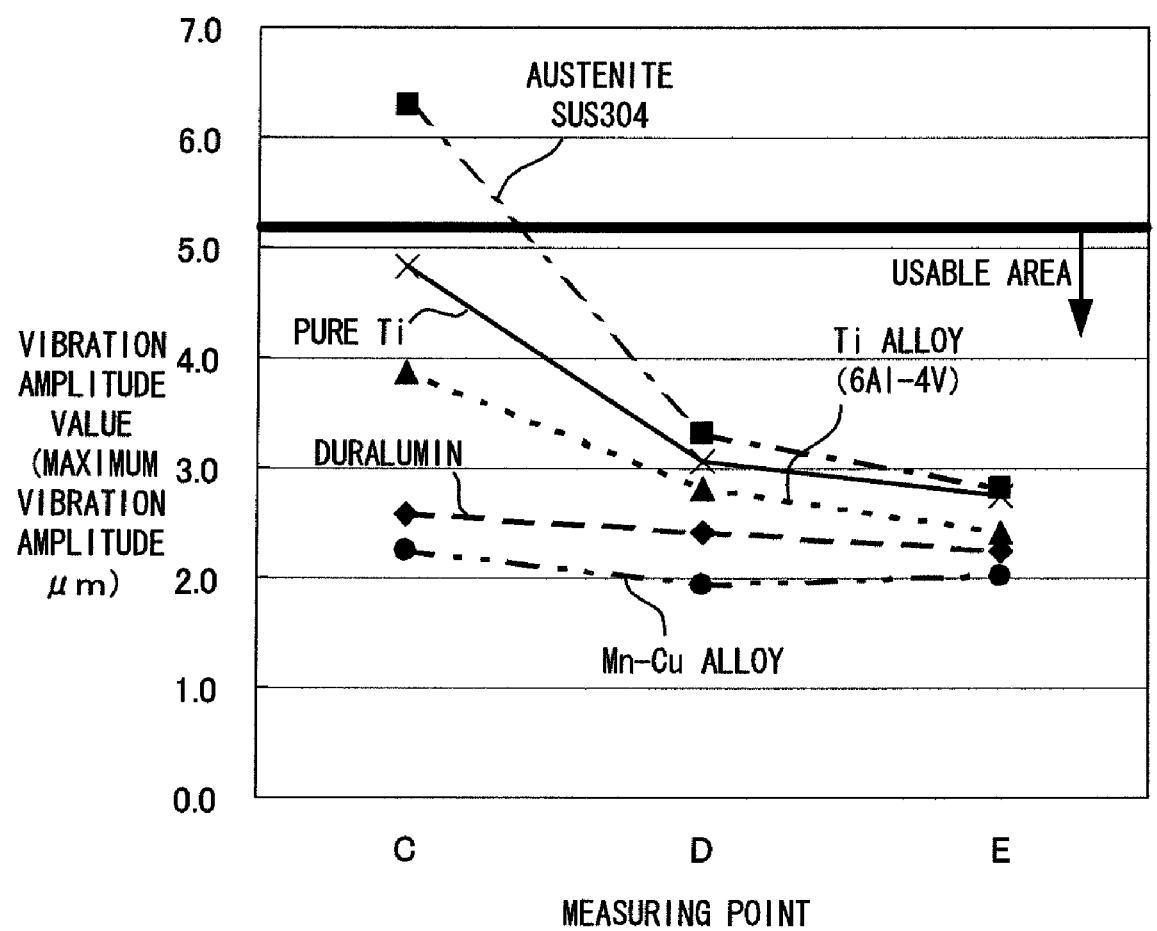
FIG. 5 is a graph illustrating the result of measured vibration amplitudes at specified points of the supporting means.
Figure 7:
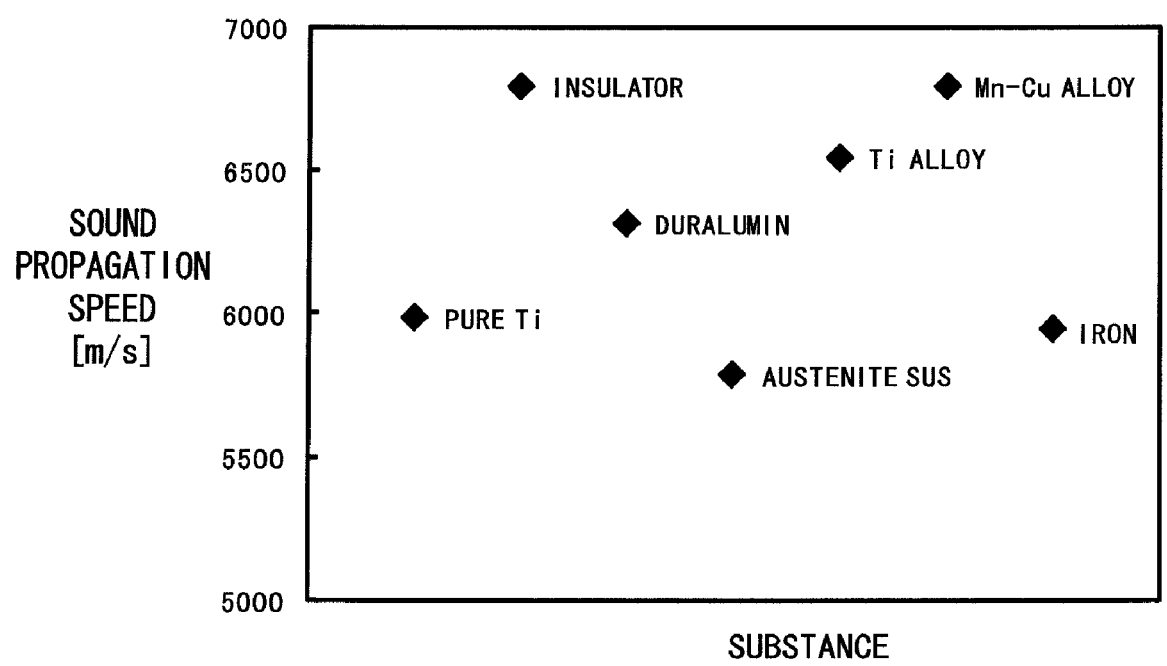
FIG. 7 is a graph illustrating sound propagation speeds of each substance.

The first embodiment of the present invention will be described referring to FIG. 1 to FIG. 4. FIG. 1 is a schematic diagram illustrating one embodiment of an ultrasonic vibration bonding device configured with a support device for resonator according to the present invention. FIG. 2 is a diagram illustrating the configuration of the resonator equipped in the ultrasonic vibration bonding device shown in FIG. 1. FIGS. 3A and 3B are a diagram of a resonator supported by a supporting means, FIG. 3A is a front view, FIG. 3B is a right-side view, with an A-A arrow line cross-section of the resonator. FIG. 4 is a basic schematic diagram illustrating an experimental device to measure the vibration amplitude of the supporting means. FIG. 5 is a graph illustrating measured results of vibration amplitudes at specified points of the supporting means, FIG. 6 is a graph illustrating a logarithmic decrement of each substance. FIG. 7 is a graph illustrating sound propagation speeds of each substance.

1. Device Configuration

The first embodiment will be described using an ultrasonic vibration bonding apparatus as an example, configured with a support device for resonator according to the present invention. This embodiment provides bonding between chip 23, which contains melting metal bump 23a of lead-tin solder on the bonding surface of the semiconductor, which is one target to be bonded, and substrate 24 with melting metal bump 24a which is another target to be bonded, utilizing ultrasonic vibration. Additionally, chip 23 is held using holding means 40 of resonator 7, which is explained later, and substrate 24 is attached to stage 10, which is explained later.

The ultrasonic vibration bonding device of the present embodiment, as shown on FIG. 1, comprises bonding mechanism 27, mounting mechanism 28 which includes stage 10 and stage table 12, position recognizing section 29, conveying section 30, and control device 31.

Bonding mechanism 27 comprises vertical drive mechanism 25 and head section 26, and vertical drive mechanism 25 is set to be able to move the resonator supporting section 6 up and down guiding on a guide 3, utilizing drive motor 1 and bolt-nut mechanism 2. Bonding mechanism 27 is clamped on frame 34, and frame 34 is attached to base plate 35 with 4 supporting poles 13 which are allocated surrounding the pressure center of head section 26. Here, a part of supporting pole 13 and frame 34 are not illustrated in the figure.

Resonator supporting section 6 is guided up and down on head release guide 5, and is attached on bolt-nut mechanism 2, which is pulled by self-droop counters 4 to cancel self-droop. Head section 26, which has resonator 7, is attached to resonator supporting section 6.

Additionally, resonator supporting section 6 is outfitted with pressure sensor 32, and is composed to be able to detect given pressure force applied on objects (chip 23, substrate 24, etc.) held between resonator 7 and stage 10. Accordingly, the applied pressures on objects that are detected by pressure sensor 32 are fed back to control device 31, and the pressure to be applied on the objects can be controlled by controlling vertical drive mechanism 25 with the relevant feedback values. Also, resonator supporting section 6 is equipped with resonator section height detector means 36, and the height of head section 26 can be detected.

Head section 26, which is outfitted on resonator supporting section 6, comprises resonator 7, transducer 8, holding means 40 to suction-hold chip 23, supporting means 44, which comprises base plate 20, first clamping device 21, and second clamping device 22.

Resonator 7 is, as shown in FIG. 2, composed with the length of the wave of the resonance frequency, so as the point f 2, which is located at almost the center of resonator 7, and both ends f 0 and f4 take the maximum vibration amplitude points. In this case, points f 3 and f 1 which are located at quarter wavelength away from the maximum vibration amplitude point, correspond to the first and second minimum vibration amplitude point respectively. Also, the cross section of resonator 7, when it is observed from the point f4 side, is circular and the resonator has a cylindrical shape.

Additionally, transducer 8 is located at point f 0 of resonator 7, so that it is concentric to the center axis of resonator 7. This transducer 8 generates ultrasonic vibration controlled by control device 31, and resonator 7 vibrates along the direction of its center axis.

Moreover, at the bottom surface of the peripheral surface of resonator 7 where point f 2, which is the maximum vibration amplitude point of resonator 7, is located, holding means 40 for holding the object, chip 23 is provided.

Holding means 40 comprises, for example, such substances as Ni, Cu, Ag, etc., and is adhered to resonator 7 with thermoset, etc. Also, holding means 40 may be cut and formed directly on resonator. Moreover, holding means 40 may be composed with materials other than metals, such as ultra-hardened tungsten carbide, ceramics, diamond, etc., and may be adhered to resonator 7 with brazing metal such as Ni, Cu, Ag, etc.

Additionally, holding means 40 is equipped with, as a sample, a holding mechanism (no figure) utilizing vacuum suction. Here, this holding mechanism may be composed with an electrostatic adsorption means, or with a mechanical-type holder to hold the object, and not limited to these means; it may be composed to hold the object by direct adhesion on holding means 40.

Also, as shown on FIG. 2, at first minimum vibration amplitude point f 3 and second minimum vibration amplitude point f 1, convex-shaped portions are formed on the peripheral surface of the resonator 7, and first portion-to-be-supported 41 and second portion-to-be-supported 42 to support the resonator 7 are composed. First portion-to-be-supported 41 and second portion-to-be-supported 42 show octagonal cross sections when cut at a vertical cross-section to the center axis of the resonator 7. Here, the shape of cross-sections of first portion-to-be-supported 41 and second portion-to-be-supported 42 is not necessarily octagonal, but rather a circle or other polygons are applicable.

And, as shown on FIG. 3A, resonator 7 is supported by supporting means 44 at first portion-to-be-supported 41 and second portion-to-be-supported 42. Supporting means 44 consists of base plate 20, first clamping means 21 and second clamping means 22, and first clamping means 21 and second clamping means 22 are composed with supporting member. Here, at least at the contact portion where first clamping means 21 contacts with first portion-to-be-supported 41, and at least at the contact portion where second clamping means 22 contacts with second portion-to-be-supported 42, if the supporting member is comprised, it is acceptable. Also, it is quite acceptable if the whole means of first clamping means 21 and second clamping means 22 are composed with the same substances of the supporting member. Substances of the supporting members will be explained in detail later.

As shown on FIG. 3 B, at second portion-to-be-supported 42, upper member 22a of second clamping means 22 which is attached to base plate 20 and lower member 22b are inserted and upper member 22a and lower member 22b are tightened by bolts 43, and second portion-to-be-supported 42 is clamped. Equally, at first portion-to-be-supported 41, upper member 21a of first clamping means 21 which is attached to base plate 20 and lower member 21b are inserted and upper member 21a and lower member 21b are tightened by bolts 43, and first portion-to-be-supported 41 is clamped.

And, it is configured that base plate 20 is fixed on resonator supporting section 6, and the pressure produced by vertical drive mechanism 25 is provided on chip 23 and substrate 24.

Also, resonator 7 is composed such that it can rotate on the center axis of resonator 7 by loosening bolts 43. For example, if there are multiple holding means 40 comprised on the peripheral surface of resonator 7, by rotating resonator 7 on the center axis of resonator 7 after loosening bolts 43, supporting means 40 can be exchanged.

Here, the method to fix resonator 7 on the first clamping means 21 and second clamping means 22 is not limited to use only bolts 43; any method is applicable, for example, a mechanical clamping mechanism to be electrically controlled, and a clamping mechanism which comprises one-touch fixing ability, is applicable.

Also, the supporting points of resonator 7 are not limited to minimum vibration amplitude points f 1, f 3; any point of resonator 7 is applicable. Also, the shape of the portion-to-be-supported 41 and second portion-to-be-supported 42 is not limited to a concave shape, a convex shape is acceptable, and the shape is optional. Also, the allocated location of holding means 40 is not limited to the maximum vibration amplitude point f 2, other maximum vibration amplitude points are acceptable, or any point other than maximum vibration amplitude point is acceptable.

Mounting mechanism 28 comprises stage 10 and stage table 12. Stage 10 comprises a holding mechanism (no fig.) to hold substrate 24. Here, as a holding mechanism of stage 10, a holding mechanism that utilizes vacuum suction is applied. Yet, the holding mechanism may utilize electrostatic adhesion, some other holding mechanism, and simply putting substrate 24 on stage 10 is also acceptable.

Additionally, stage table 12 comprises a shifting axis which is rotary and able to move parallel, and is composed to move to adjust the location of substrate 24 against chip 23.

Position recognizing section 29 comprises an upper/lower mark check means 14 which is inserted between chip 23 and substrate 24, placed face to face, and recognizes each alignment mark for recognizing location attached on upper chip 23 and lower substrate 24, vibration amplitude recognizing device 33 which checks the vibration amplitude of chip 23, substrate 24 and resonator 7, and moving table 15 to move upper/lower mark check means 14 and vibration amplitude inspection unit 33 horizontally and/or vertically.

Conveying section 30 comprises chip supply device 16 to transfer chip 23 and chip tray 17, and substrate transfer device 18 to transfer substrate 24 and substrate transfer conveyer 19.

Control device 31 controls pressures loaded on head section 26 and ultrasonic vibration energy which is determined with voltages and/or electric currents to be provided to transducer 8, etc. Moreover, control device 31, is equipped with a control panel (no fig.) to control the entire ultrasonic vibration bonding device, and controls vertical drive mechanism 25 with the detected signal of the height of head section 26 provided by resonator height check means 36, and can adjust the height of head section 26 in the direction of the arrow Z shown in FIG. 1.

2. The Principle of the Control Effect of Abnormal Vibration and Supporting Member Regarding substances in supporting member of supporting means 44, which supports resonator 7, the present inventor carried out the following tests and found the conditions to be suitable as substances in the supporting member.

FIG. 4 is a schematic diagram illustrating the test device used for the test, and the entire first and second clamping means 21 and 22 on supporting means 44 shown in FIG. 3 comprise the substances that are used in the supporting member, and the vibration amplitudes were measured. As shown in FIG. 4, the test device has the supporting member 51 and 52, which correspond to the first and second clamping means 21, 22, on the upper surface of base plate 50, and supporting member 51 and 52 are inserted in first portion-to-be-supported 41 and second portion-to-be-supported 42 of the resonator 7 to support resonator 7. Also, to absorb abnormal vibration that have different vibration directions than that of resonator 7, first portion-to-be-supported 41 and second portion-to-be-supported 42 are formed on the minimum vibration amplitude points of resonator 7 (corresponding to f 1 and f 3 in FIG. 2), and these points are supported with supporting member 51 and 52. Here, by composing the entire first and second clamping means 21 and 22 with substances that compose the supporting member, at measuring point C, D and E shown in FIG. 4, it is possible to compare the vibration amplitude change, and the fairness of the measurements of the control effects of vibration is secured.

Also, laser beams were irradiated toward the direction of the center axis of resonator 7, and toward supporting member 51 and 52, and the vibration amplitudes of supporting member 51 and 52 were measured by amplitude measurement means 55. Amplitude measurement means 55 is set vertically movable on a drive mechanism (no fig.), was moved to the desired measuring point, and was able to measure vibration amplitude of supporting member 51.

In this present test, under the condition of supporting resonator 7 with supporting member 51 and 52 which comprise various substances, and with resonator 7 being resonated, as described in FIG. 4, the vibration amplitude of supporting member 51 at point C which is close to resonator 7, at the center point D, and at point E which is close to the base plate were measured.

FIG. 5 is, as an example of the test results, a graph describing the vibration amplitudes of supporting member 51 and 52 in case they are made of Austenite stainless (SUS304), pure Ti, Ti alloy (6Al-4V), Al alloy (duralumin), Mn—Cu—Ni—Fe alloy which is a product of Daido Steel (Co., Ltd) and is Mn—Cu alloy which is a twin-type damping alloy with Ni, Fe, etc. being additionally added.

As described in FIG. 5, for example, in case supporting member 51 is made of SUS 304, as supporting member 51 is vibrating with vibration from resonator 7 at point C near resonator 7, the vibration amplitude is large, and the vibration amplitude is small at point E near base plate 50. The pure Ti and the Ti alloy also indicate the same tendencies as SUS303, the vibration amplitudes at point C near resonator 7 are both smaller than that of SUS304.

In the case of duralumin and Mn—Cu alloy, at point C near resonator 7, the vibration amplitudes are small although the point is close to resonator 7. Also, it is shown that their vibration amplitudes at points C, D and E do not change. Accordingly, duralumin and Mn—Cu alloy produce great results controlling abnormal vibration of resonator 7.

Also, when these substances are actually comprised in an ultrasonic vibration bonding device and are used, among those substances described in FIG. 5, pure Ti, duralumin, and Mn—Cu alloy can be used considering changes in resonating frequencies and/or if there is any unusual sounds produced.

Here we study the criteria for the selection of a usable substance based on characteristics of each substance. First, the logarithmic decrement of each substance is focused on and studied. A logarithmic decrement is a characteristic to indicate the absorption rate of vibration; the higher the logarithmic decrement of a substance, the harder it is to transfer vibration and the faster vibration is absorbed. The logarithmic decrement of various substances are described in FIG. 6.

The Mn—Cu alloy, which showed the minimum vibration amplitude described in FIG. 5, corresponds to the silencer shown in FIG. 6, and its logarithmic decrement is 0.7~0.8. Accordingly, as the abnormal vibration generated by resonator 7 is absorbed swiftly by Mn—Cu alloy, we can consider that the abnormal vibration of resonator 7 is effectively controlled.

Also, regarding other substances, for example, comparing flake graphite-cast iron with spherical graphite-cast iron, generally it is known that the flake graphite-cast iron is more superior as a vibration control substance, than the spherical graphite-cast iron. Also, ferrite stainless described in FIG. 6 is inhered to have 50 times more vibration absorption effect than Austenite stainless; and it is known that the austenite stainless is superior as a vibration control substance.

Accordingly, as described in FIG. 6, we can consider that substances with a logarithmic decrement of more than 0.01 and less than 1 are suitable as substances for supporting member. Also, as practical applications, those substances with a logarithmic decrement of more than 0.1 are considered desirable.

On the other hand, despite the logarithmic decrement of duralumin which are Al alloys and Ti alloy, as described in FIG. 6, are less than 0.01, the test result described in FIG. 5 indicates that these substances show smaller vibration amplitude and are superior as vibration control substances. And next, the criteria of selecting substances for the supporting member of resonator 7 are studied paying attention to the sound propagation speeds of each substance.

A sound propagation speed is the speed at which a vibration is transmitted, the higher the sound propagation speed, the faster the vibration is transmitted through substances and diffused. FIG. 7 describes sound propagation speeds of various substances. As described in FIG. 7, the sound propagation speed of duralumin, which showed small vibration amplitude as described in FIG. 5 as the test result, is 6320 m/s, and that of Ti alloy is 6500 m/s. Also, the sound propagation speed of Austenite stainless is 5790 m/s. Accordingly, as substances that have higher sound propagation speeds diffuse the abnormal vibration of resonator 7 faster, we can consider that the abnormal vibration of resonator 7 is controlled effectively.

Also, according to opinions, etc. obtained through practical usages, etc., as pure Ti with sound propagation speed of 5990 m/s and iron with that of 5950 m/s are possible to be used as vibration control substances, we can consider that those substances, which have more than 5900 m/s of sound propagation speed, are suitable as substances for supporting member. Also, for practical use, these substances that have more than 6000 m/s of sound propagation speed are desirable.

In the present embodiment, the entire clamping means, first clamping means 21 and second clamping means 22 are composed with twin type damping alloy (the Mn—Cu alloy, for example), which satisfy both conditions, the logarithmic decrement and the sound propagation speed, and first clamping means 21 and second clamping means 22 are inserted in first portion-to-be-supported 41 and second portion-to-be-supported 42 of resonator 7 and support resonator 7 by clamping first portion-to-be-supported 41 and second portion-to-be-supported 42.

We will note here that the twin type damping alloy is a material in which twin crystals are generated inside it when a load is applied, and the twin crystals change their sizes and move around according to amount of the load applied. Also, the kinetic energy is converted into thermal energy by the generation and movement of the twin crystals and the loads are absorbed. Once vibrations are put on the twin crystal-damping alloy, the vibrations are absorbed inside of the material and the transmission of the vibrations is controlled. Accordingly, this alloy is being used in various fields as a material to control vibration.

On the other hand, because an ultrasonic vibration bonding device, as described in the present embodiment, utilizes ultrasonic vibration provided by a resonator, abnormal vibrations that have different directions of vibration than that of resonator 7 should be controlled, but resonator 7 itself must operate steadily at a specified frequency. Accordingly, if the twin crystal damping alloy is used as supporting member of resonator 7, it is supposed that the vibration of resonator 7 itself may be absorbed, thus traditionally, the twin crystal damping alloy has not been used as supporting member of resonator 7.

However, through test conducted by the inventor, it was proven that when twin crystal damping alloy is used as the supporting member of resonator 7, it absorbs abnormal vibration of resonator 7 and can also make the vibration of resonator 7 itself stable at a specified frequency at the same time. We can consider that this is because the twin crystal-damping alloy generates microscopic twin crystals one after another in the material according to the frequencies of the vibration, which is the so-called vibration of the frequency band of the ultrasonic vibration. Accordingly, it might be said that twin crystal damping alloy is suitable as supporting member of resonator 7. Note that it is best to compose first clamping means 21 and second clamping means 22 with Mn—Cu alloy, which is a type of twin crystal damping alloy, namely Mn—Cu—Ni—Fe alloy, which is a Mn—Cu alloy with Ni, Fe, etc.

Note that the substances of the supporting member is not limited to the twin crystal damping alloy, but any substance that has logarithmic decrement in the range of 0.01~0.1 or, has a sound propagation speed of more than 5900 m/s is applicable. Also, if supporting means 44, which is comprised of the aforementioned material, contacts on first portion-to-be-supported 41 and second portion-to-be-supported 42 of resonator 7, supporting means 44 can be of any shape and size.

3. Bonding Movement

Next, a series of movements that will bond melting metal bump 23a of chip 23 and melting metal bump 24a of substrate 24 to mount chip 23 on the surface of substrate 24, utilizing ultrasonic vibration, will be described.

First we will set the objects, chip 23 and substrate 24. Chip 23 is supplied from chip tray 17 to holding means 40 of resonator 7 by chip supply device 16, and is held by suction. Additionally, substrate 24 is supplied from substrate transport conveyer 19 to stage 10 by substrate transport device 18, and is held by suction.

The upper/lower mark recognizing means 14 is inserted between chip 23 and substrate 24, each surface of them to be bonded is placed face-to-face and held, by moving table 15, and the positions of each alignment mark to align position of chip 23 and substrate 24 are detected by upper/lower mark recognizing means 14. Then, taking the position of chip 23 as a reference, the position of chip 23 and substrate 24 is adjusted by moving the position of substrate 24 in parallel and by rotating.

Next, under the condition in which the bonding portions of chip 23 and substrate 24 are aligned (the positions of melting metal bumps 23a and 24a are aligned), upper/lower mark recognizing means 14 is removed by moving table 15. Next, the descent of head section 26 is started by vertical drive mechanism 25, and chip 23 and substrate 24 are placed closer. Then, when melting metal bump 23a of chip 23 and melting metal bump 24a of substrate 24 contact, the condition that chip 23 and substrate 24 were pinched between resonator 7 and stage 10 is detected by the detection signal from pressure sensor 32.

Next, vertical drive motor 1, which is placed on vertical drive mechanism 25, is controlled by control device 31, and the specified pressure is applied on chip 23 and substrate 24, the ultrasonic vibration bonding is started.

During bonding, for example, the ultrasonic vibration energy calculated with the voltage and the electric current put on transducer 8, the resonated vibration amplitude of resonator 7 and the applied pressure are observed and controlled by control device 31.

At least a part of the first and second clamping means 21 and 22 of supporting means 44 to support resonator 7 is composed of the supporting member, which comprise the aforementioned substance, abnormal vibrations, etc. which have other vibration directions than that of resonator 7 are absorbed effectively by supporting means 44, and at the same time, resonator 7 vibrates steadily at the specified frequency. We will note here that because the bonding surfaces of chip 23 and substrate 24 contain minute irregularities and uneven heights, etc. among the multiple melting metal bumps 23a and 24a, when the bonded area is gradually expanded during the bonding process, the bonded strength between chip 23 and substrate 24 is gradually strengthened, and the size of relative vibration amplitude between chip 23 and substrate 24 becomes gradually smaller.

Next, when the bonding strength between chip 23 and substrate 24 becomes larger than the frictional force between holding means 40, which is holding chip 23, and chip 23 or between substrate 24 and stage 10, if a force that is larger than the maximum static frictional force between holding means 40 and chip 23 or between substrate 24 and stage 10 is applied between holding means 40 and chip 23 or between substrate 24 and stage 10, the frictional force between holding means 40 and chip 23 or between substrate 24 and stage 10 will change from static frictional force to dynamic frictional force, and holding means 40 and chip 23 or substrate 24 and stage 10 will start to vibrate relatively. Accordingly, because the ultrasonic vibration provided by resonator 7 (transducer 8) is not transmitted to chip 23 and substrate 24 completely, the bonding does not progress.

Then, if the applied pressure is increased to make the friction force between holding means 40 and chip 23 or between substrate 24 and stage 10 bigger with time function base from the beginning of bonding, the relative vibration amplitude between holding means 40 and chip 23 or between substrate 24 and stage 10 are controlled, ultrasonic vibration is transmitted to chip 23, and because the relative vibration amplitude between chip 23 and substrate 24 increases, new surfaces form on the surfaces to be bonded of chip 23 and substrate 24, and the bond area will expand.

Also, as described above, as the larger the bonded area expanded, the smaller the relative amplitude between chip 23 and substrate 24 becomes, the controls of increasing the applied pressure and the ultrasonic vibration energy, while maintaining the specified value of the relative vibration amplitude between chip 23 and substrate 24, are carried out.

Specifically, the relative vibration amplitude between chip 23 and substrate 24 is measured by vibration amplitude recognizing device 33 while bonding under specified pressure p and ultrasonic vibration energy e controlled by control device 31, and if the measured relative vibration amplitude between chip 23 and substrate 24 becomes smaller than the specified value, pressure and ultrasonic vibration energy are controlled to increase $\Delta p$ and $\Delta e$, respectively, by control device 31. It is better to obtain the optimum values of $\Delta p$ and $\Delta e$ for the types, etc. of chip 23 and substrate 24 in advance.

Also, control of the ultrasonic vibration energy, for example, may be carried out by controlling the electric current while maintaining the voltage of transducer 8 at a specified value, so that the phase of the applied voltage and the electric current is matched, and in addition, so that the sizes of the vibration amplitude of resonator 7 and the relative vibration amplitude between chip 23 and substrate 24 are kept at specified values.

Note, as an example, it has been set that the generated frequency of transducer 8 is 40 kHz, and the applied voltage on transducer 8 is in the range of 0V~10V. Also, as an example, although it may vary with materials, areas, etc., the relative vibration amplitude between chip 23 and substrate 24 is in the range of about $0.1\mu$~$0.5\mu$.

Additionally, when the bonded area has reached the target value, the bonding is finished. The necessary pressure, the necessary ultrasonic vibration energy and the time necessary to complete bonding should be calculated in advance to achieve the target area to be bonded, and the time of completion is the time when the target value has been satisfied.

When the bonding between chip 23 and substrate 24 is complete, the suction-adhesion of chip 23 by resonator 7 is released, and a return drive of head section 26 is carried out. After that, with chip 23, substrate 24, which is held on stage 10, is transferred to substrate transport conveyer 19 by substrate transport device 18, and the bonding process series is completed.

Accordingly, as described in the aforementioned embodiment, at the portions of first and second clamping means 21 and 22 of supporting means 44 where they contact with portion-to-be-supported 41 and 42 and support resonator 7 by being clamped on first portion-to-be-supported 41 and second portion-to-be-supported 42, if supporting members that comprise the substance with a logarithmic decrement of lager than 0.01 and smaller than 1.0 are placed, the absorbing speed of vibration is fast, and the abnormal vibration and directions of which are different from that of resonator 7, can be absorbed accurately by the supporting member at the contact points with resonator 7. Also, the supporting member allow resonator 7 to vibrate at the specified vibration steadily, sticking with the natural vibration frequency of resonator 7. Additionally, a logarithmic decrement of more than 0.1 is desirable for the substance of the supporting member.

Also, at the portions of first and second clamping means 21 and 22 of supporting means 44 where they contact with both portion-to-be-supported 41 and 42 and support resonator 7 by being clamped on first portion-to-be-supported 41 and second portion-to-be-supported 42, if supporting member that comprise the substance with a sound propagation speed of more than 5900 m/s are placed, the transmission speed of vibration is fast, and the abnormal vibration and directions of which are different from that of the resonator are diffused accurately by the supporting member at the portions where they contact with resonator 7. Also, the supporting member allow resonator 7 to vibrate at a specified vibration steadily, sticking with the natural vibration frequency of resonator 7. Note that a sound propagation speed of more than 600 m/s desirable for the substance of the supporting members. Note that, of course it is acceptable to form the whole of first and second clamping means 21 and 21 with the substance described above.

Also, because it is possible to transmit the ultrasonic vibration effectively to chip 23 and substrate 24 by composing the supporting member with the substance described above, the portion to support resonator 7 is not limited to the nodal point, any point can be supported. Accordingly, because the locations and the sizes, etc. of supporting means 44 can change according to the sizes and shapes, etc. of chip 23 and substrate 24, the configuration of the device can change. Moreover, because the sizes of the supporting member can be smaller and/or the numbers of the supporting member can be reduced, it is possible to make the device smaller and/or simpler.

Second Embodiment

Figure 8A:
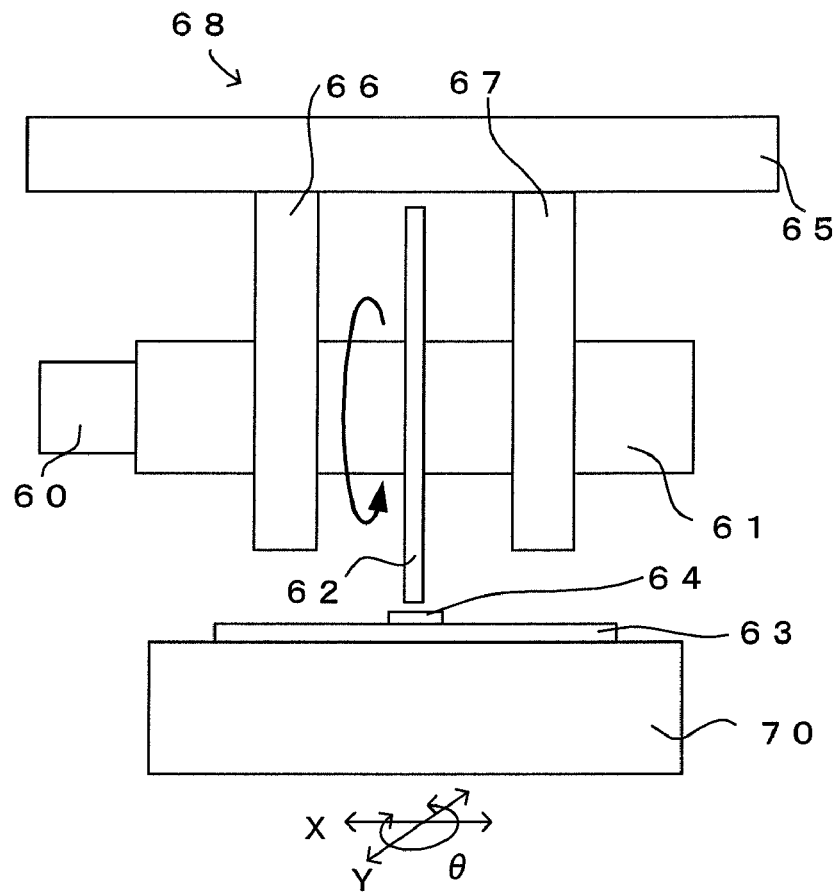
FIGS. 8A and 8B are a partial schematic diagram illustrating a configuration of an ultrasonic vibration bonding device according to the second embodiment of the present invention.
Figure 8B:
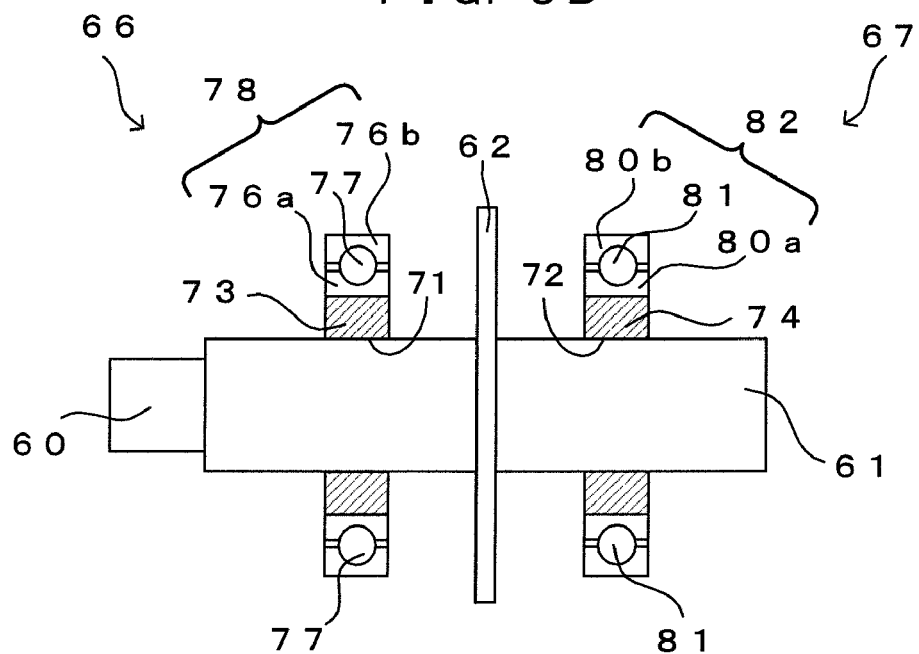
Figure 9A:
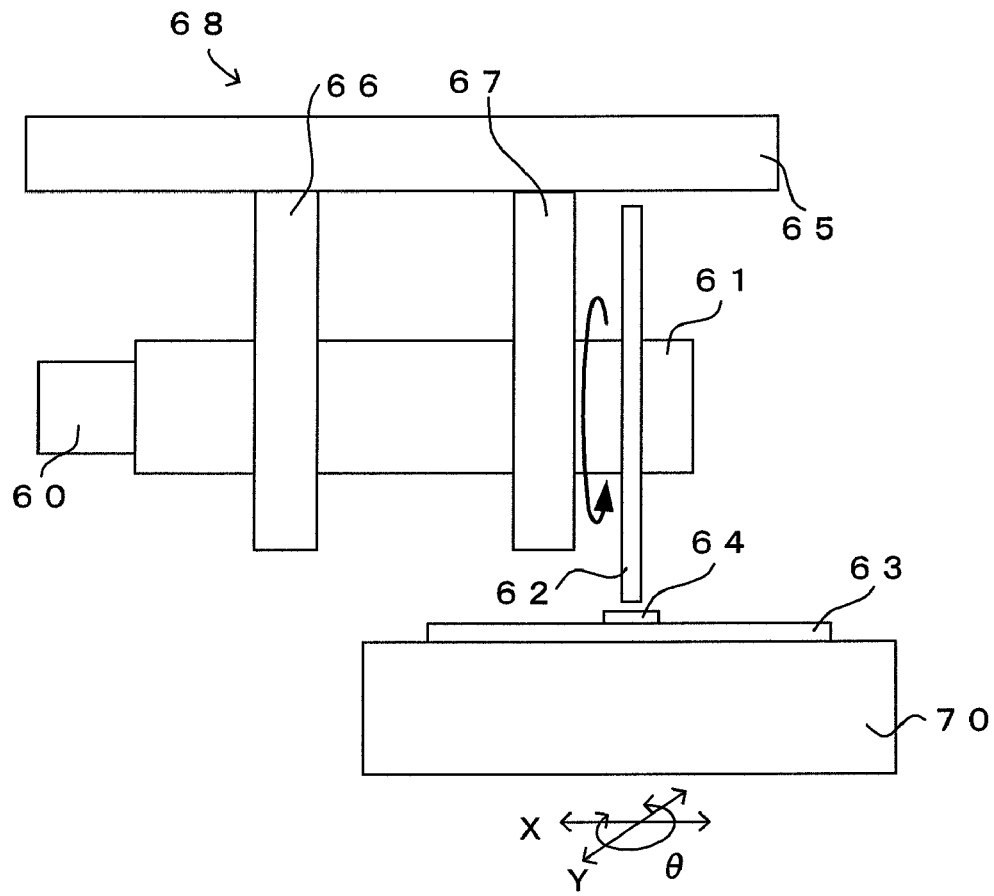
FIGS. 9A and 9B are a partial schematic diagram illustrating a configuration of another example of the ultrasonic vibration bonding device shown in FIGS. 8A and 8B.
Figure 9B:
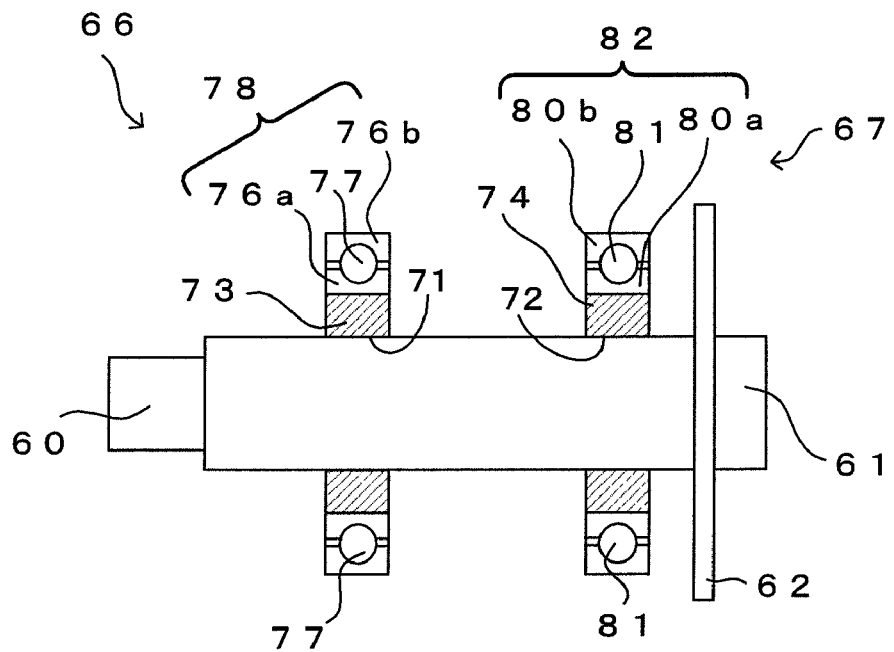

Next, a second embodiment of the present invention will be described referring to FIGS. 8A to 9B. FIGS. 8A and 8B is a partial schematic diagram illustrating a configuration of an ultrasonic vibration bonding device according to a second embodiment of the present invention, FIG. 8A is a front view, FIG. 8B is a partial cross section. FIGS. 9A and 9B is a partial schematic diagram illustrating a configuration of another example of an ultrasonic vibration bonding device described in FIGS. 8A and 8B, FIG. 9A is a front view, FIG. 9B is a partial cross section. Additionally, the differences from the first embodiment will be described in detail. Note that if the reference characters used in FIGS. 8A to 9B are the same as those used in FIG. 1 to FIG. 4, they are the same or correspondent.

The point of the ultrasonic vibration bonding device described in the present embodiment that is different from the first embodiment is that resonator 61 with transducer 60 installed is rotated along a specified direction while vibrating, and pressing section 62, which is equipped on resonator 61, carries out bonding of the objects, substrates 63 and 64.

As shown in FIG. 8A, head section 26 of the present embodiment is equipped with resonator 61 with transducer 60 installed, pressing section 62, pedestal section 65, and supporting means 68 which comprises first clamping means 66 and second clamping means 67. Note that because supporting means 68 is the same as supporting means 44 described in the first embodiment, the description is omitted. Also, because stage 70 is the same as stage 10 described in the first embodiment, the description is omitted.

As shown in FIG. 8B, first portion-to-be-supported 71 and second portion-to-be-supported 72 are formed on the peripheral surface of resonator 61, the portions of the first and second clamping means 66 and 67, which contact with both sections to be supported 66 and 67, comprise supporting member 73 and 74, and both portion-to-be-supported 71 and 72, are supported by these supporting member 73 and 74. Also, ball bearing 78, which comprises spheres 77 between inner section 76a and outer section 76b, is on the outskirts of supporting member 73. Additionally, inner section 76a, outer section 76b, and spheres 77 are composed to slide among them.

Similarly, ball bearing 82, which comprises spheres 81 between inner section 80a and outer section 80b, is on the outskirts of supporting member 74. Also, inner section 80a, outer section 80b, and spheres 81 are composed to slide among them. Accordingly, resonator 61, pressing section 62, supporting member 73 and 74, and inner sections 76a and 80a, are all composed to rotate freely as a whole.

Additionally, as shown in FIG. 8A, substrate 63 as one object is placed on the upper surface of stage 70, and substrate 64 as the other object is placed on the specified location of the upper surface of substrate 63.

Additionally, pressing section 62 is lowered by vertical drive mechanism 25 (see FIG. 1) so that pressing section 62 is contacted at the specified location of the upper surface of substrate 64, then substrate 63 and substrate 64 are pressed facing each other, and an ultrasonic vibration is applied.

At this time, because stage 70 is moved in the direction of Y shown in FIG. 8A by stage table 12 of mounting mechanism 28 (see FIG. 1), pressing section 62, which is pressing substrates 63 and 64 as the objects, are rotated following the movement of stage 70. Accordingly, resonator 61, supporting member 73 and 74, inner section 76a and 80a, which are united with pressing section 62, are also rotated. Accordingly, the section to be bonded between substrate 63 and substrate 64 is pressed by pressing section 62 and is bonded while it is being moved by stage table 12.

Next, another example of the ultrasonic vibration bonding device shown in FIGS. 8A and 8B will be described referring to FIGS. 9A and 9B. The different point from the ultrasonic vibration bonding device shown in FIGS. 8A and 8B is that pressing section 62 is attached on the outskirts of resonator 61, which is located outside of supporting means 67, and because other configurations and movements are the same as the ultrasonic vibration bonding device shown in FIGS. 8A and 8B, the description of the configurations and the movements are omitted. Even if it is configured like this, substrate 63 and substrate 64 are possible to be bonded by pressing substrate 63 and substrate 64 by pressing section 62 while they are being moved by table 12.

Accordingly, with the second embodiment, even if substrates 63 and 64 are large and/or slender, the bonding process will be conducted continuously and efficiently by moving the portions to be bonded of substrate 63 and substrate 64.

Also, the movements of ball bearings 78 and 82 are not necessarily passive as described above, but they may be composed of a drive mechanism which comprises a drive motor, etc., and voluntarily rotate with the drive mechanism. Also, in this case, stage 70 may be a configuration to move passive, and the substance of bearings 78 and 82 may be composed of the same substance of supporting member 73 and 74.

Third Embodiment

Next, the third embodiment of the present invention will be described referring to FIGS. 10 and 11. FIG. 10 is a partial schematic diagram illustrating a head section and a stage section of an ultrasonic vibration bonding device according to the third embodiment of the presented invention, FIG. 11 is a graph illustrating results of measurements of vibration amplitudes of a resonator and a stage of an ultrasonic vibration bonding device according to the third embodiment of the present invention. Hereinafter, the different points from the first embodiment will be described in detail. Note that if the reference characters used in FIG. 1 to FIG. 9B are the same as those used in FIG. 10, FIG. 11, they are the same or correspondent.

The points of the ultrasonic vibration bonding device of the present embodiment from the first embodiment that are different from the first embodiment are, in addition to the fact that first clamping means 21 and second clamping means 22 are composed of the supporting member, the fact that the entire stage 90, which holds substrate 24, is composed of the holding member for controlling vibration transfer. In the present embodiment, as shown in FIG. 10, the entire stage 90 is composed of the holding members for controlling vibration transfer that comprise the twin crystal type damping alloy described above (for example Mn—Cu alloy, described).

As shown in FIG. 10, if chip 23 held on resonator 7 and substrate 24 held on stage 90 are contacted and an ultrasonic vibration is applied, not only chip 23 and substrate 24, but stage 10 itself also vibrates as the ultrasonic vibration is transferred to stage 10 via chip 23 and substrate 24. Accordingly, by composing stage 10 with the holding member for controlling vibration transfer, the stage vibration described above can be considered as controlled and the ultrasonic vibration can be applied to chip 23 and substrate 24 effectively.

Now, as shown in FIG. 10, a laser beam from vibration amplitude measuring means 95 was irradiated toward the direction of the center axis of resonator 7, and the vibration amplitudes of stage 90, in the case that it is composed of steel, and in the case that it is composed of holding member for controlling vibration transfer, were measured by vibration amplitude measuring means 95. FIG. 11 describes the measured results. Note that the vibration amplitude of resonator 7 was also measured and the measured results were included in the same figure.

Note that as vibration amplitude measuring means 95 is set such that it can move vertically by a drive mechanism (no fig.), the vibration amplitudes of stage 90 and resonator 7 can be measured after the vibration amplitude measuring means 95 is moved to the specified measuring location. Also, in the test, under the condition that resonator 7 is being resonated, as shown in FIG. 10, the vibration amplitude of stage 90 was measured at location F where the laser beam can be irradiated on the stage 90, and the vibration amplitude of resonator 7 was measured at location G where the laser beam can be irradiated on resonator 7.

As shown in FIG. 11, when 100% of the ultrasonic vibration energy was applied on resonator 7, the vibration amplitude of stage 90 was 3 μm in the case that it is composed of steel. Also, the vibration amplitude of resonator 7 was 10 μm at the time. Accordingly, in this case, as the relative vibration amplitude between chip 23 held on resonator 7 and substrate 24 held on stage 90 becomes 7 μm, chip 23 and substrate 24 are friction-slid with a vibration amplitude of 7 μm.

On the other hand, in the case that stage 90 is composed of the holding member for controlling vibration transfer, as shown in FIG. 11, when 100% of the ultrasonic vibration energy was applied to resonator 7, the vibration amplitude of stage 90 was 0.2 μm. Accordingly, in this case, as the relative vibration amplitude between chip 23 held on resonator 7 and substrate 24 held on stage 90 becomes 9.8 μm, chip 23 and substrate 24 are friction-slid with a vibration amplitude of 9.8 μm. Accordingly, in the case that stage 90 is composed of the holding member for controlling vibration transfer, the ultrasonic vibration transferred to stage 90 via chip 23 and substrate 24 is controlled by the holding member for control vibration transfer, the relative vibration amplitude between chip 23 and substrate 24 increases, and chip 23 and substrate 24 can be bonded effectively.

Accordingly, with the third embodiment, because stage 90, which places substrate 24, is composed of the holding member for controlling vibration transfer, the ultrasonic vibration that is transferred from resonator 7 via chip 23 and substrate 24 is controlled accurately by the holding member for controlling vibration transfer. Accordingly, it is now possible to increase the relative vibration amplitude between chip 23 and substrate 24 by controlling the vibration of stage 90, and to bond chip 23 and substrate 24 by applying the ultrasonic vibration effectively.

Note that if the holding member for controlling vibration transfer described above are composed of a substance having a logarithmic decrement larger than 0.01 and smaller than 1.0, the ultrasonic vibration that is transferred to stage 90 is absorbed accurately by the holding member for controlling vibration transfer, and the vibration of stage 90 is controlled. Here, a logarithmic decrement of more than 0.1 is desirable for the holding member for controlling vibration transfer.

Also, if the holding member for controlling vibration transfer described above are composed of a substance with a sound propagation speed of more than 5900 m/s, the ultrasonic vibration that is transferred to stage 90 is diffused accurately by the holding member for controlling vibration transfer, and the vibration of stage 90 is controlled. Additionally, a sound propagation speed of more than 6000 m/s is desirable for the holding member for controlling vibration transfer.

Note that the substance of the holding member for controlling vibration transfer is not limited to the twin crystal damping alloy described in the present embodiment; any substance that has a logarithmic decrement in the range of 0.01~1.0 or a sound propagation speed of more than 5900 m/s is applicable. Also, in the case that the entire stage 90 is not composed of the holding member for controlling vibration transfer, it is acceptable if at least the holding surface of stage 90 is composed of the holding member for controlling vibration transfer.

Fourth Embodiment

Figure 12:
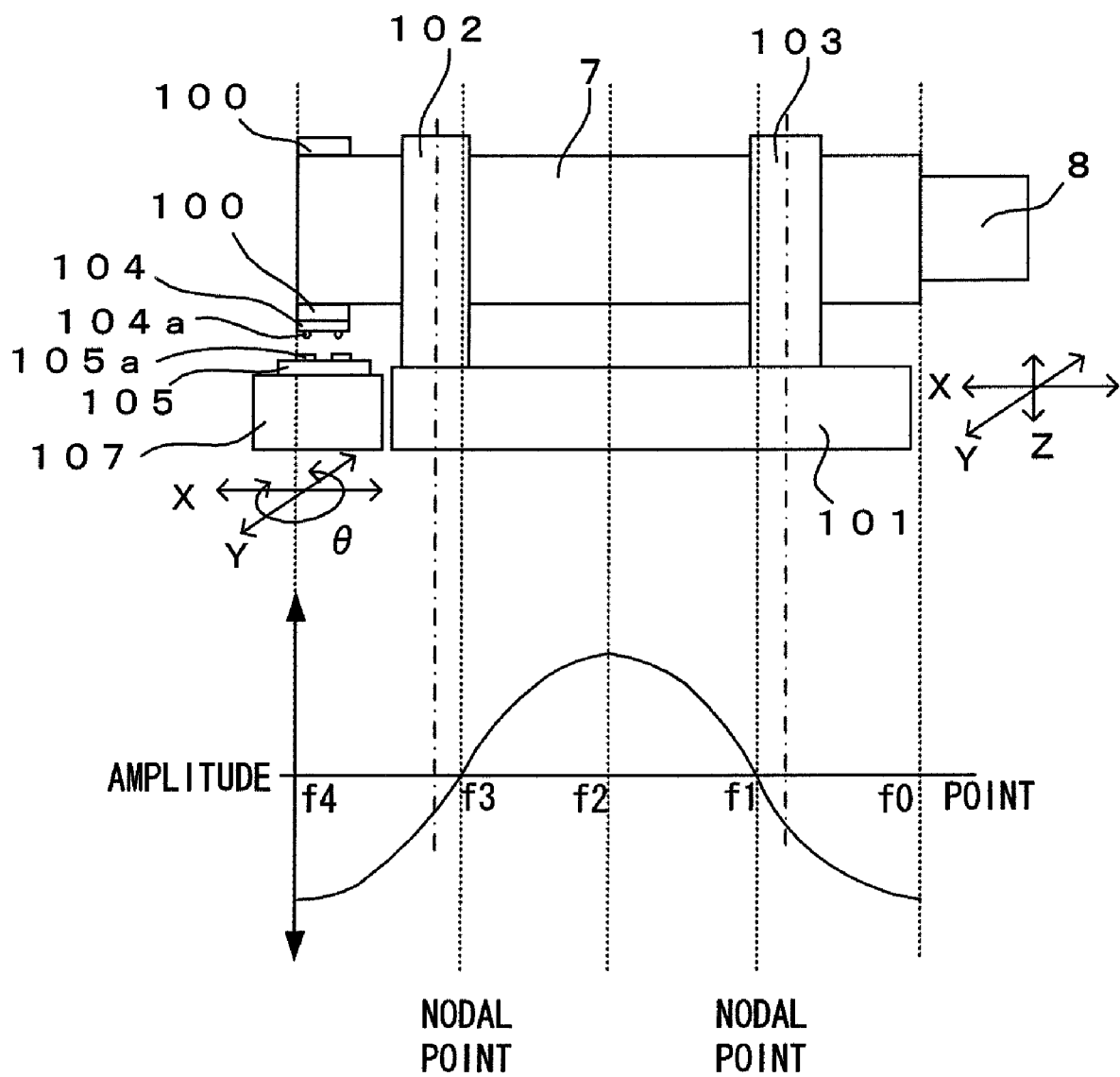
FIG. 12 is a partial schematic diagram illustrating a configuration of an ultrasonic vibration bonding device according to the fourth embodiment of the present invention.

Next, the fourth embodiment of the present invention will be described referring to FIG. 12. FIG. 12 is a partial schematic diagram illustrating an ultrasonic vibration bonding device according to the fourth embodiment. Hereinafter, the differences from the first embodiment will be described in detail. Note that if the reference characters used in FIG. 1 to FIG. 11 are the same as those used in FIG. 12, they are the same or correspondent.

The points of the present embodiment that are different from the first embodiment are that resonator 7 is supported at a portion other than the nodal point, and holding means 100 is composed at the opposite end of the end where transducer 8 is placed. Note that because stage 107 is the same as stage 10 of the first embodiment, the description is omitted.

As shown in FIG. 12, holding means 100, which holds the object, chip 104, is composed at around the opposite end (left end) of the end (right end) where transducer 8 of resonator 7 is placed, and on two portions, the upper and lower portion of the peripheral surface of resonator 7. Also, concave-shape portion-to-be-supported (no fig.) are composed on two places of the outer surface of resonator 7, which are closer to one end and the other end of resonator 7 than nodal points f1 and f3. Additionally, the portion-to-be-supported are clamped with first clamping means 102 and second clamping means 103, each of which is composed of the supporting member, and resonator 7 is supported. First clamping means 102 and second clamping means 103 are composed to be supported by supporting pedestal 101, and with supporting pedestal 101, they are moved to X direction, Y direction, and Z direction, as shown in the same figure by the moving mechanism (no fig.) placed on supporting pedestal 101, and the position of holding means 100 of resonator 7 is moved to the specified location.

Also, as shown in FIG. 12, substrate 105, which is one of the object, is placed on the upper surface of stage 107. Supporting pedestal 101 is lowered, by the moving mechanism described above, so that the specified melting metal bump 104a on chip 104 and the specified melting metal bump 105a on substrate 105 contact with each other. Chip 104 and substrate 105 are placed face-to-face and bonded by ultrasonic vibration.

According to the description of the fourth embodiment, the space between first clamping means 102 and second clamping means 103 is set wide, and first clamping means 102 and second clamping means 103, which support resonator 7, are composed on places closer to both ends of resonator 7 than the nodal points f1 and f3, and also because first clamping means 102 is placed near holding means 100, it supports resonator 7 with high rigidity and controls abnormal vibrations of resonator 7, and can let resonator 7 vibrate at the specified vibration consistently while keeping the natural vibration frequency of resonator 7 without deviation. Accordingly, chip 104 and substrate 105 can be pressed with a stronger pressing force.

Also, because holding means 100 is composed near another end of resonator 7, for example, bonding can be processed inside an object that is box-shaped. Moreover, because holding means 100 is composed on two portions (the upper and lower portions) of the outer surface of another end of resonator 7, it is possible to replace holding means 100 by rotating resonator 7 180 degrees around the axis of the resonator.

Note that if the contact portions of first and second clamping means 102 and 103 where they contact with the portion-to-be-supported are composed of the supporting member, it is acceptable that a part of first and second clamping means 102 and 103 is composed of the supporting member, and/or that the entire first and second clamping means 102 and 103 are composed of the supporting member. Also, the shape of the portion-to-be-supported that is composed on the outer surface of the resonator is not limited to be a concave-shape; any shape is acceptable.

Also, it is acceptable to compose stage 107 of a holding member for controlling vibration transfer, and it is also acceptable to configure such that the vibration of stage 7 is controlled with a holding member for controlling vibration transfer and that ultrasonic vibration is applied effectively to chip 103 and substrate 104.

Fifth Embodiment

Figure 13:
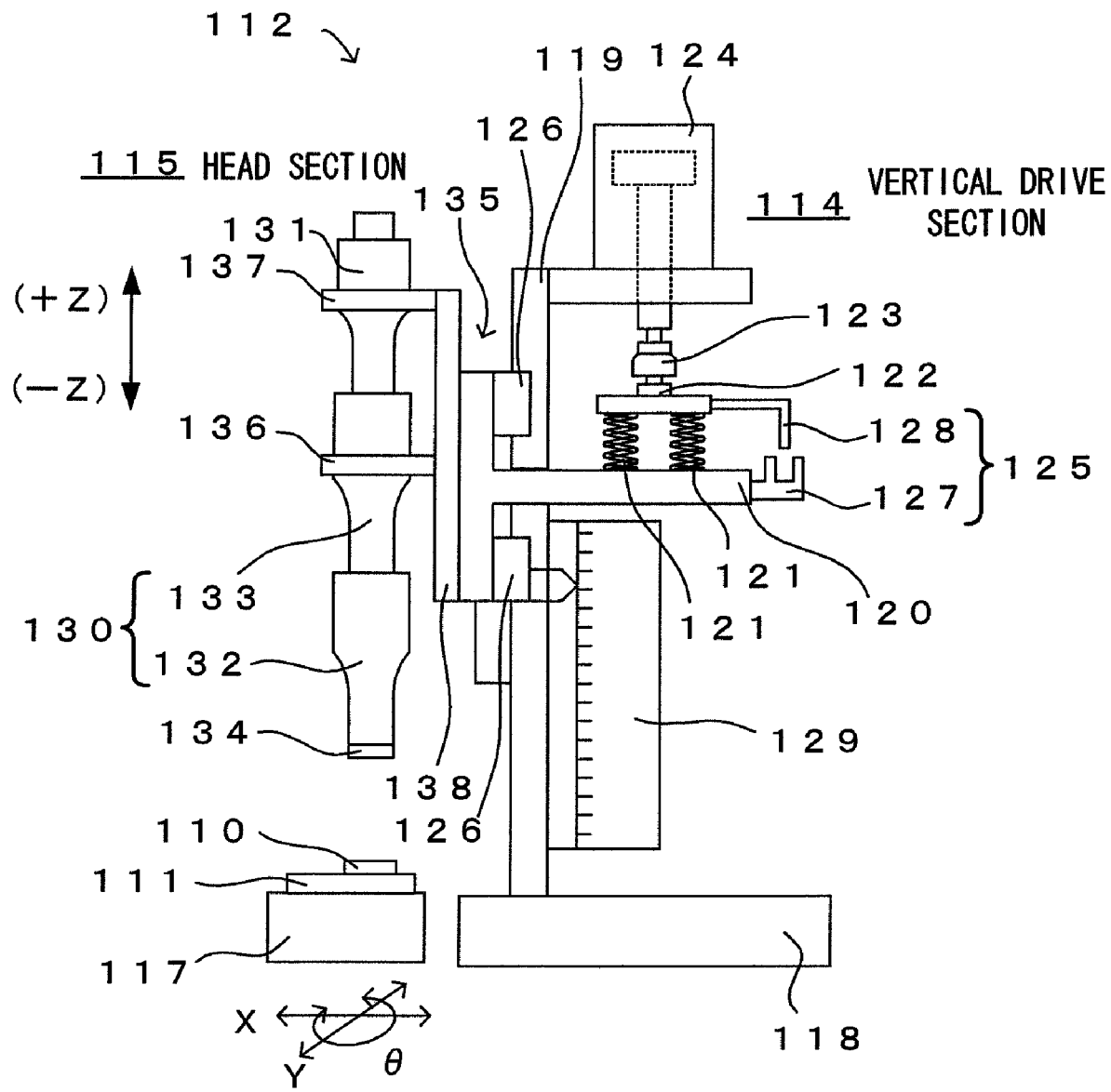
FIG. 13 is a schematic diagram illustrating a configuration of a vertical vibration-type ultrasonic vibration bonding device according to the fifth embodiment of the present invention.
Figure 14:
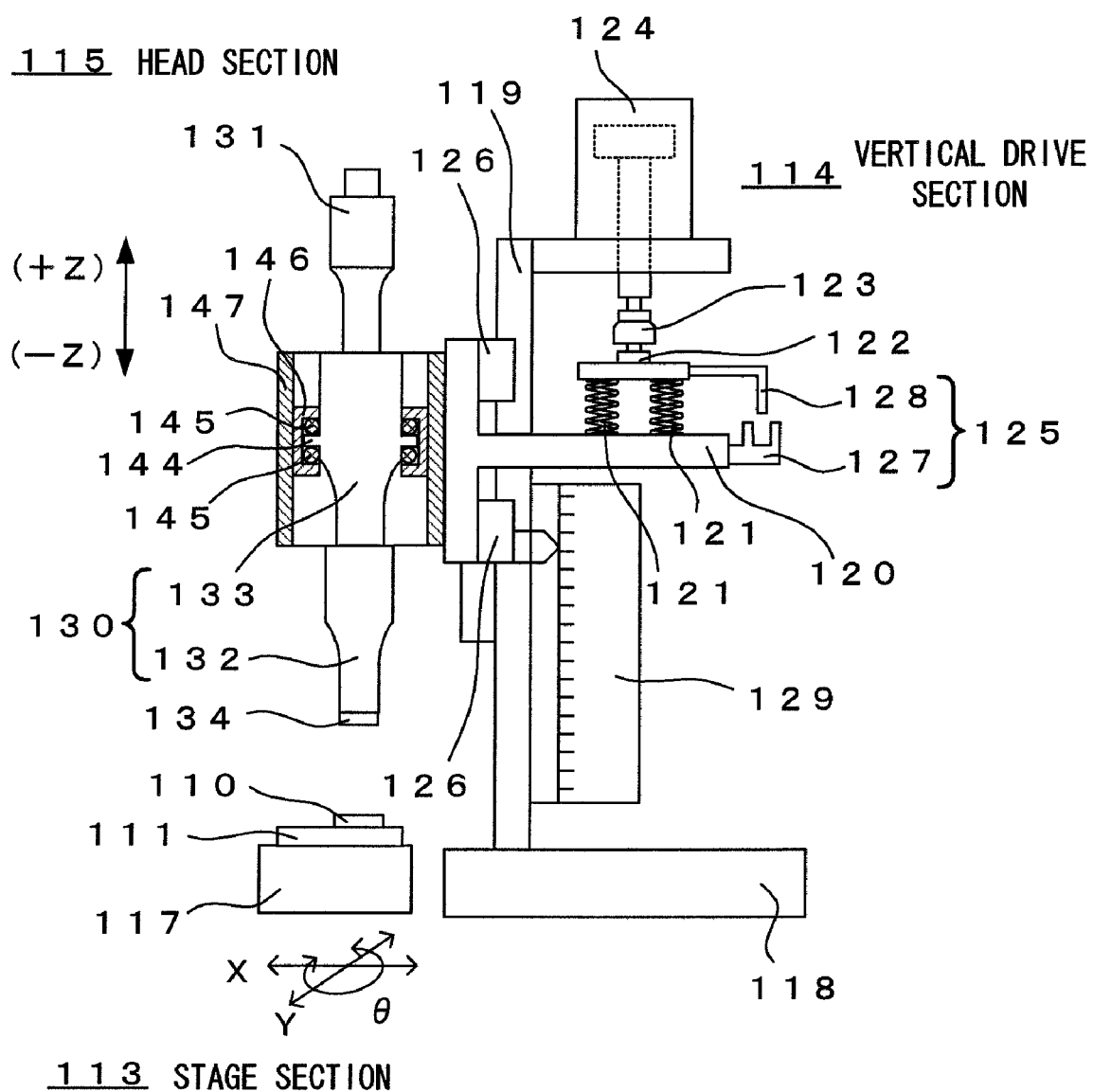
FIG. 14 is a schematic diagram illustrating a configuration of a conventional virtual vibration-type ultrasonic vibration bonding device as a comparison sample to the fifth embodiment.
Figure 15:
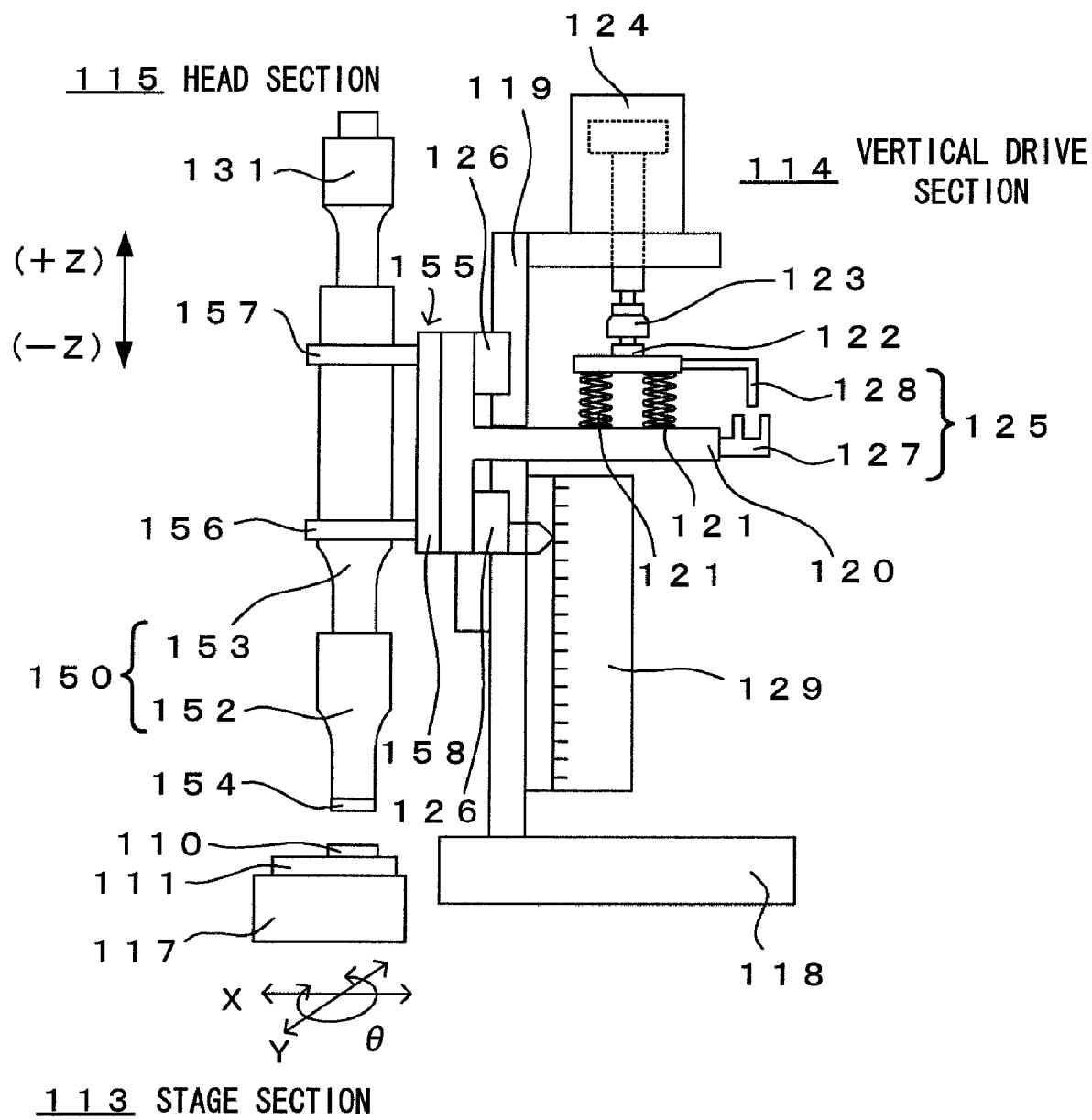
FIG. 15 is a schematic diagram illustrating a configuration of another example of a vertical vibration-type ultra sonic bonding device according to the fifth embodiment of the present invention.

Next, the fifth embodiment of the present invention will be described referring to FIG. 13 to FIG. 15. FIG. 13 is a schematic diagram illustrating a vertical vibration-type ultrasonic vibration bonding device according to the fifth embodiment of the present invention, FIG. 14 is a partial schematic diagram illustrating a traditional vertical vibration-type ultrasonic vibration bonding device as a comparison, FIG. 15 is a schematic diagram illustrating a vertical vibration-type ultrasonic vibration bonding device as an another example according to the fifth embodiment of the present invention. Hereinafter, the different points from the first embodiment will be described in detail. Note that if the reference characters used in FIG. 13 to FIG. 15 are the same as those used in FIG. 1 to FIG. 12, they are the same or correspondent.

The points of the present embodiment that are different from the first embodiment are that this is a vertical vibration-type ultrasonic vibration bonding device, and the direction of the ultrasonic vibration which is applied to the objects, chip 110 and substrate 111, is perpendicular to the faces of chip 110 and substrate 111. This vertical vibration-type ultrasonic vibration bonding device is equipped with support device for resonator according to the present invention.

As shown in FIG. 13, the vertical vibration-type ultrasonic vibration bonding device 112 comprises stage section 113, vertical drive section 114, and head section 115.

Stage section 113 comprises stage 117 where the objects, chip 110 and substrate 111, are placed. Note that because stage 117 is the same as stage 10 described in the first embodiment, the description is omitted.

Vertical drive section 114 comprises supporting pole 119 on the upper surface of stand 118, supporting rack 120, springs 121, load cell 122 which detects pressing forces, cylinder joint 123, air cylinder 124, and trigger section 125. Also, supporting rack 120 is equipped with guide 126, and when the pressure of air cylinder 124 is increased or decreased, supporting rack 120 is moved vertically via cylinder joint 123, load cell 122 and springs 121, and guide 126 is slid along supporting pole 119 vertically together with supporting rack 120, thus, head section 115 is moved vertically.

Also, trigger section 125 comprises sensor section 127 and dog 128. Sensor section 127 is placed on the edge of supporting rack 120, and has a concave portion, and there is a photo-micron sensor equipped inside of it. Also, dog 128 is placed facing sensor section 127, allowing it to go in and out at the concave portion of sensor section 127. Additionally, it is composed such that once springs 121 are pressed by air cylinder 124 and shrunk, dog 128 is inserted into the concave portion of sensor section 127, and if dog 128 is detected by the photo-micron sensor of sensor section 127, voltage is applied to transducer 131 of head section 115, which is described later, and transducer 131 vibrates, then resonator 130 resonates. Note that trigger section 125 may be composed of another switch mechanism. Also, it may be composed such that while load cell 122 is checking the pressing force applied by air cylinder 124, voltage is applied to transducer 131 when a specified pressing force is detected.

Moreover, it is composed such that linear encoder 129 is equipped on supporting pole 119, and it can detect the height of head section 115 according to the vertical movement of guide 126.

Head section 115 comprises resonator 130 and transducer 131. Resonator 130 is composed such that the length along the axis direction is a half of one wave width of the natural vibration frequency of the resonator, and both ends of resonator 130 are the maximum vibration amplitude points, and the points quarter wave-width away from the maximum vibration amplitude points are the minimum vibration amplitude points (nodal points). Also, resonator 130 comprises horn 132 and intermediate booster 133, and intermediate booster 133 comprises transducer 131 on its one end, and horn 132 on another end. On the other end of horn 132, which is the opposite end where intermediate booster 133 is placed, a bonding section 134, which contacts objects and applies ultrasonic vibrations, is composed.

Also, resonator 130 is composed so that it is supported by supporting means 135 and placed on supporting rack 120. Supporting means 135 has first clamping means 136, second clamping means 136, and base section 138, and first clamping means 136 is inserted into a concave portion-to-be-supported (no fig.) formed on the peripheral surface of resonator 133, second clamping means 137 is inserted into a concave portion-to-be-supported (no fig.) formed on the peripheral surface of transducer 131, and resonator 130 is supported. Also, the portions of first and second clamping means 136 and 137, where the portion-to-be-supported are contacted, comprise supporting member, and resonator 130 is supported by these supporting member. Note that the shapes of the portion-to-be-supported formed on the peripheral surface of intermediate booster 133 and transducer 131 do not need to be concave, and the entire first and second clamping means 136 and 137 may be composed of the supporting member.

Note that head section 115 of the traditional vertical vibration-type ultrasonic vibration bonding device, which is referred to as a sample to compare with the fifth embodiment as shown in FIG. 14, is composed to have a convex portions 144 formed on the peripheral surface of intermediate booster 133 of resonator 130, and O rings 145, which are composed of 2 silicon O rings, are placed. O rings 145 and convex portions 144 are clamped to the concave portions of supporting section 146 and supported, and they are stored in tube section 147 placed on supporting rack 120. According to this type of configuration, because O rings 145 are made of silicon rubber and are soft, especially if resonator 130 is supported at a position other than nodal points, and when an ultrasonic vibration is generated by putting voltage on transducer 131, it is difficult to control abnormal vibrations, etc. generated in the entire resonator 130, and also it is difficult to have resonator 130 vibrate at the specified vibration consistently without the natural vibration frequency of the resonator being shifted. Also, because this embodiment applies an ultrasonic vibration in a vertical direction to the surfaces of objects, if the ultrasonic vibration is not stable, too much pressing force is applied to the objects and there is a possibility that the objects may be destroyed. Also, to support resonator 130 vibrating at a specified vibration frequency consistently without the natural vibration frequency of the resonator being shifted, the configuration of the support device becomes big and complicated, and it is difficult to make the device to be smaller and/or simpler.

On the other hand, if the configuration of the device as described in the fifth embodiment of the present invention as shown in FIG. 13 is adopted, resonator 130 is supported consistently at a location other than the nodal points, resonator 130 can be vibrated at a specified vibration consistently without the natural vibration frequency of the resonator 130 being shifted, and it is possible to bond chip 110 and substrate 111 accurately preventing breakage of the objects. Also, it is possible to make the whole device smaller and/or simpler.

Next, another example of a vertical vibration-type ultrasonic vibration bonding device according to the fifth embodiment will be described. Resonator 150 shown in FIG. 15 is composed such that the length along the axis direction is a wavelength of the natural vibration frequency of the resonator, both ends and the center of resonator 150 are the maximum vibration amplitude points, the points at quarter wavewidth away from the maximum vibration amplitude points are the minimum vibration amplitude points (nodal points). Also, resonator 150 comprises horn 152 and intermediate booster 153, and intermediate booster 153 comprises transducer 131 on one end and horn 152 on another end. Additionally, on the other end of horn 152, which is the end opposite of where intermediate booster 153 is placed, bonding section 154, which contacts objects and applies ultrasonic vibrations, is composed.

Also, resonator 150 is composed to be supported by supporting means 155 and placed on supporting rack 120. It is composed that supporting means 155 has first clamping means 156 and second clamping means 157, and base section 158. First and second clamping means 156 and 157 are clamped to concave portions to be supported (no fig.) formed on the peripheral surface of intermediate booster 153, and resonator 150 is supported. With this type of configuration, resonator 150 can be vibrated at a specified vibration consistently without the natural vibration frequency of the resonator being shifted.

Also, as with the vertical vibration-type ultrasonic vibration bonding device shown in FIG. 13, the portions that contact the sections to be supported of first and second clamping means 156 and 157 comprise supporting member. Also, the shapes of the portion-to-be-supported on the peripheral surface of intermediate booster 153 do not need to be concaveshaped, and all of first and second clamping means 156 and 157 may be composed of the supporting member.

Accordingly, with the fifth embodiment, even if it is a vertical vibration-type ultrasonic vibration bonding device, it is possible to let resonators 130 and 150 vibrate at specified frequencies consistently without the natural vibration frequencies of resonator 130 and 150 being shifted, and it is possible to bond objects accurately without breaking the objects. Also, it is possible to make the entire device smaller and/or simpler.

Sixth Embodiment

Figure 16:
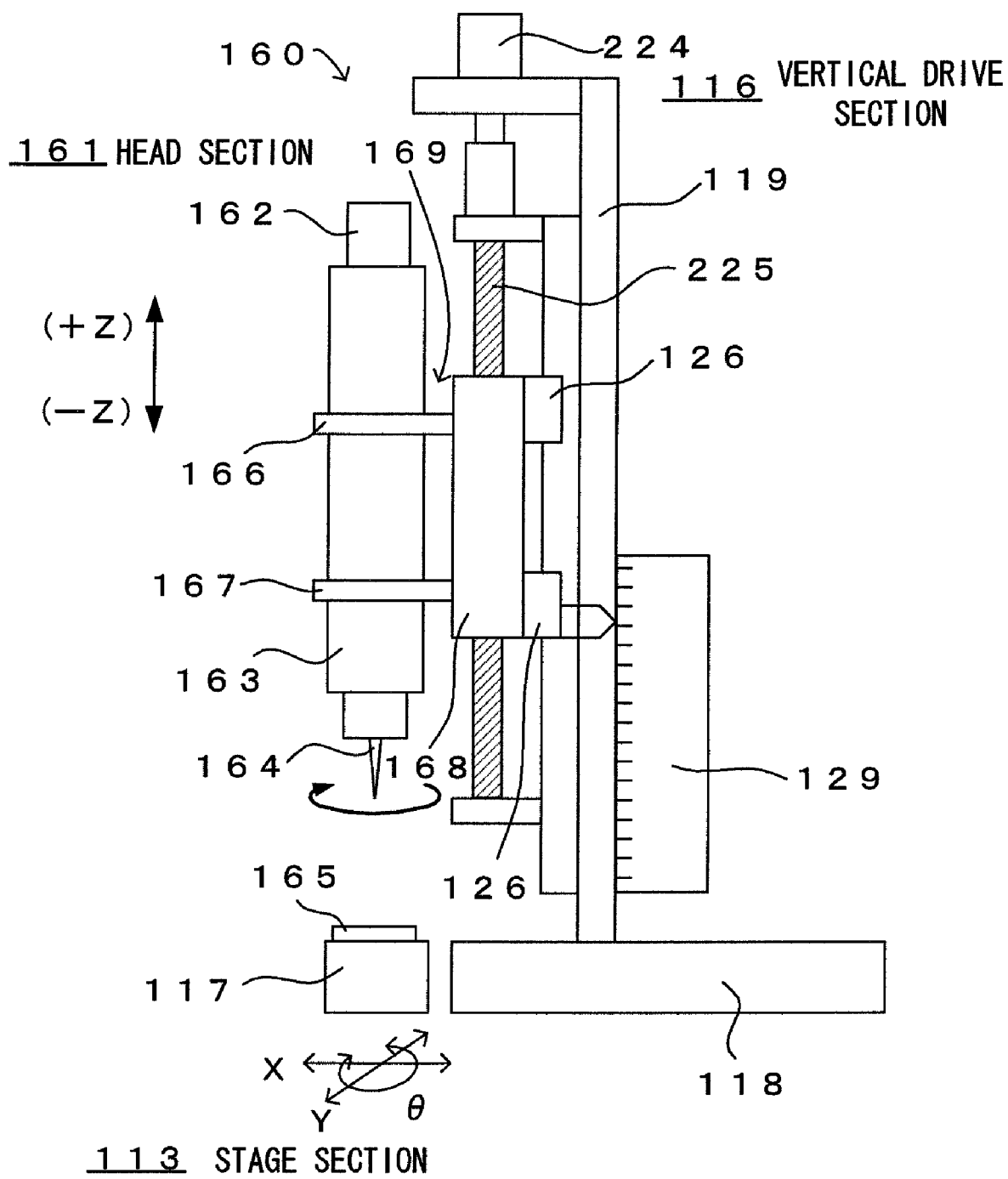
FIG. 16 is a schematic diagram illustrating a configuration of an ultrasonic vibration cutting device according to the sixth embodiment of the present invention.
Figure 17:
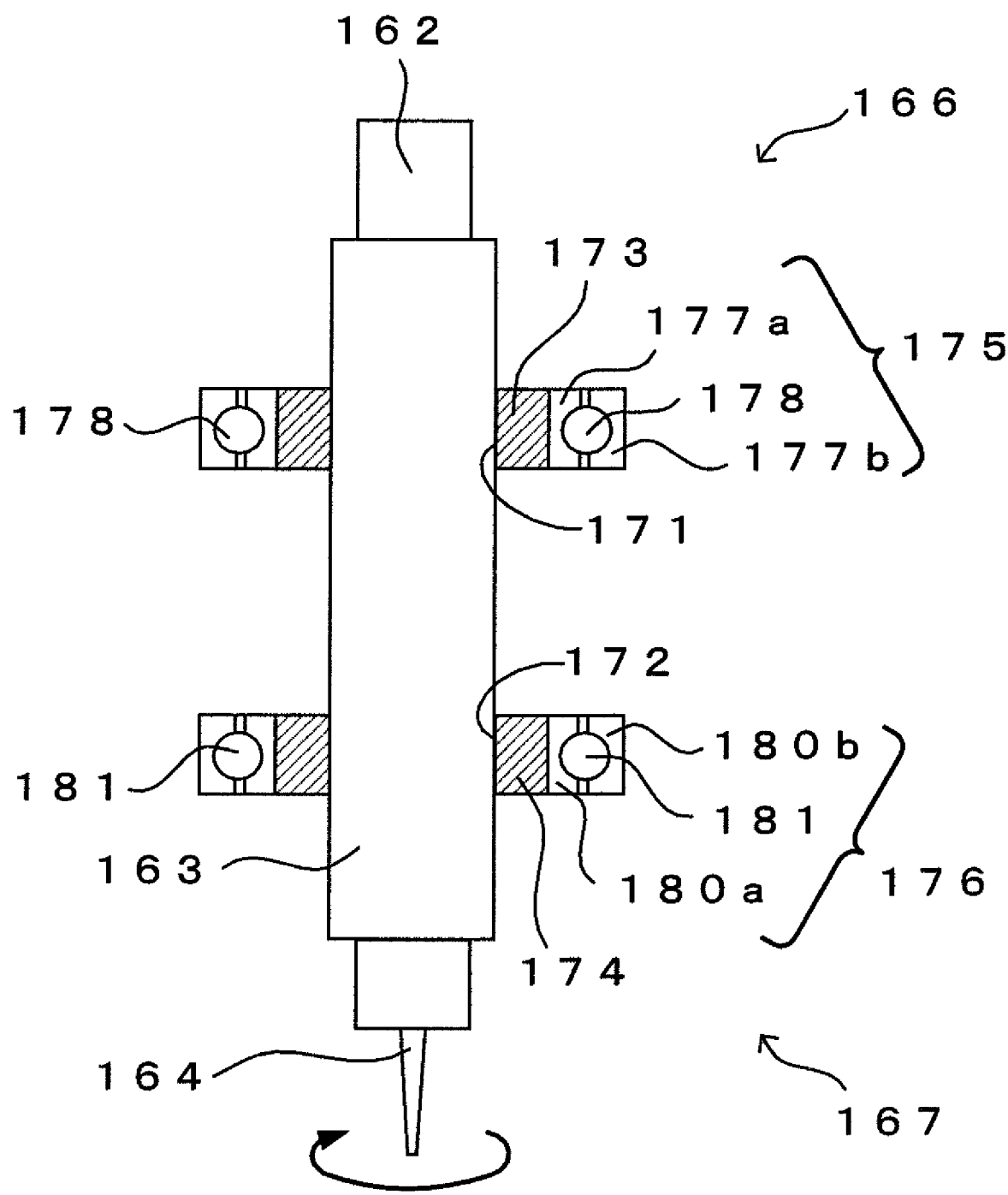
FIG. 17 is a partial schematic diagram illustrating the configuration of the resonator shown in FIG. 16.

Next, the sixth embodiment of the present invention will be described referring to FIG. 16 and FIG. 17. For the sixth embodiment, an ultrasonic vibration cutting device, which is equipped with a support device for resonator according to the present invention, is described as an example. FIG. 16 is a schematic diagram illustrating an ultrasonic vibration cutting device according to the sixth embodiment of the present invention, and FIG. 17 is a partial schematic diagram illustrating the resonator of the ultrasonic vibration cutting device shown in FIG. 16. Hereinafter, the points that are different from the fifth embodiment will be described in detail. Note that if the reference characters used in FIG. 16 and FIG. 17 are the same as those used in FIG. 1 to FIG. 15, they are the same and/or correspondent.

The points of the sixth embodiment that are different from the fifth embodiment are that this is an ultrasonic vibration cutting device with support device 160 equipped according to the present embodiment, that resonator 163 rotates toward a specified direction while it is vertically vibrating in the same way as the fifth embodiment, and that the object to be cut, which is substrate 165, is cut by blade 164 placed on resonator 163.

As shown in FIG. 16, head section 161 of the present embodiment comprises resonator 163 with transducer 162 equipped, blade 164, and resonator 163 is supported by supporting means 169 which is composed of first clamping means 166, second clamping means 167, and base section 168. Resonator 163 is supported on vertical drive section 116 by ball screw 225 being screwed into the screw hall (no fig.) holed on base section 168.

As shown in FIG. 16, vertical drive section 116 comprises vertical drive motor 224 and ball screw 225, and base section 168, which is screwed on ball screw 225, moves up and down with the rotation of vertical drive motor 224. Thus, head section 161 moves up and down with guide 126, which is composed on base section 168, stick-sliding on the convex portion composed on supporting pole 119. Also, linear encoder 129 is placed on supporting pole 119, and because of this, the height of head section 116 is detected. Note that because stage section 113 is the same as stage section 113 of the fifth embodiment, the description is omitted.

As shown in FIG. 17, first portion-to-be-supported 171 and second portion-to-be-supported 172 are composed on the peripheral surface of resonator 163, and each of them is supported by first and second clamping means 166 and 167. Also, first and second clamping means 166 and 167 comprise supporting member 173 and 174 at the portions where they contact both portion-to-be-supported 171 and 172, and ball bearings 175 and 176 are equipped on the outskirts of the supporting member.

Ball bearing 175 comprises inner circumference section 177a, outer circumference section 177b, and balls 178 between inner circumference 177a and outer circumference 177b, and inner circumference section 177a, outer circumference section 177b, and balls 178 are composed to stick-slide each other. Similarly, ball bearing 176 comprises inner circumference section 180a, outer circumference section 180b, and balls 181 between inner circumference 180a and outer circumference 180b, and inner circumference section 180a, outer circumference section 180b, and balls 181 are composed to stick-slide each other.

Also, resonator 163 comprises a drive mechanism of a rotary motor, etc., the figure of which is not shown, and resonator 163, blade 164, supporting member 173 and 174, and inner sections 177a and 180a are composed to rotate as a unit.

Moreover, as shown in FIG. 16, the object, substrate 165, is placed on the upper surface of stage 117, and blade 164 is lowered by vertical drive section 116 so that it contacts the specified location on upper surface of substrate 165, then an ultrasonic vibration (vertical vibration), the direction of which is vertical to the upper surface of substrate 165, is applied and substrate 165 is cut.

Accordingly, with the sixth embodiment, using supporting device according to the present invention that is equipped on an ultrasonic vibration cutting device, it is possible to cut substrate 165 efficiently while keeping the resonator vibration consistent.

Note that it is acceptable to compose ball bearings 175 and 176 themselves of the same substance as supporting member 173 and 174. Also, stage 117 may be composed of a holding member for controlling vibration transfer, and it is acceptable that by controlling vibrations of stage 117 with the holding member for controlling vibration transfer, an ultrasonic vibration is applied to substrate 165 effectively.

Note that the present invention is not limited to the embodiments described above, and various changes other than those described above may be possible as far as the purposes of the invention are not deviated from.

For example, the support device of a resonator according to the present invention is not limited to be assembled in an ultrasonic vibration bonding device and an ultrasonic vibration cutting device, but it may be assembled in various processing devices and other devices that utilize ultrasonic vibrations. Also, the direction of the ultrasonic vibration that is applied to a substrate, etc. may be parallel or vertical to the surface of the substrate.

Also, the supporting means is not limited to supporting a resonator at one place, but it may be composed to support at two or more places. Also, if a supporting member is comprised at a portion where the clamping means contacts the portion-to-be-supported, a part of the clamping means may be composed of the supporting member, or the entire clamping means may be composed of the supporting member.

Also, the shape, substance, size, etc. of a resonator is not limited to be the above-mentioned embodiment, but rather any variety is acceptable. Also, the shape of a portion-to-be-supported that is composed on the peripheral surface of a resonator is not limited to concave, but rather any shape is acceptable. Moreover, the length of the center direction of a resonator is not limited to a wavelength of the natural vibration frequency of the resonator, but rather any length is acceptable.

Also, in the case of the first embodiment described above, holding means 40 is directly affixed to resonator 7 by a heat-hardened type adhesive, but the method of the adhesion is not limited to heat-hardened type adhesive, for example, after a surface to be adhered of a ceramic is plated with Ni, etc., they may be soldered with metal solders such as Ag, Cu, Ni, etc. as an adhesive. Also, the method to affix them is not limited to be an adhesion; it is acceptable to attach holding means 40 directly on resonator 7 with bolts, etc. Also, it may be a part of resonator 7, such as by cutting it away.

Also, with the control methods of the first embodiment described above, the completion time of the bonding is established by the pre-calculated voltage, current, pressing power, time, etc. that are necessary to achieve the target bonding area, but it is acceptable that the completion time is the time when the ultrasonic vibration energy starts to decline while the ultrasonic vibration energy of transducer 8 is being observed. In this case, because the completion time for each object is determined regardless of the type of the objects and condition of the surfaces, etc. of the objects, it is possible to prevent the continuous application of pressure and the ultrasonic vibration energy to chip 23 and substrate 24 after the bonding has been completed, and it is possible to prevent the breakage of chip 23 and/or substrate 24.

Also, regarding the configuration of the device, in order to determine the relative vibration amplitude of chip 23 and substrate 24, it is acceptable that plural vibration amplitude recognizing devices 33 are installed to measure the vibration amplitudes of chip 23 and substrate 24 at the same time and determine the relative vibration amplitude, or, after measuring the vibration amplitudes of chip 23 and substrate 24 in turn by one vibration amplitude recognizing device 33, then by shifting one time axis and laying it on the other time axis, the vibration amplitude difference is calculated and the relative vibration amplitude of chip 23 and substrate 24 can be measured. Also, if chip 23 and substrate 24 are securely held on resonator 7 and on stage 10 respectively, it is acceptable to detect either vibration amplitude, chip 23 or substrate 24.

Also, for vibration amplitude recognizing device 33, any of these that are well known, such as eddy current type, capacitance type, light irradiation type, sound wave recognizing type, etc., may be applicable. By using these means, when comparing to when a laser-Doppler measurement device, for example, is used, it is possible to achieve a low cost.

Also, on position recognizing section 29, other than upper/lower mark recognizing means 14 and amplitude recognizing device 33, when light-emitting diodes are the objects and are bonded, a luminescence point recognizing means may be installed to adjust each location of the objects utilizing the luminescence of the concerned light-emitting diodes to be activated electrically.

Moreover, it is acceptable that chip 23 and substrate 24 are bonded by the ultrasonic vibration while they are being heated by heaters 9 and 11 installed on base section 20 and stage 10 of the supporting means. Note that any type of heating methods for heaters 9 and 11, such as a constant heating type and/or a pulsation heating type, is applicable. Also, heater 9, which is used to heat chip 23, may be installed not only on base section 20, but also on first and second clamping means 21 and 22, on holding means 40 or, on resonator 7.

In this case, because two energies (energy generated by an ultrasonic vibration and energy supplied by heating) are used jointly, chip 23 and substrate 24 can be bonded effectively by the generated bonding energy. Also, by controlling timing and temperatures of the heating, etc. together with the pressure and the ultrasonic vibration energy utilizing control device 31, chip 23 and substrate 24 can be bonded and formed as a device using less pressure and less ultrasonic vibration energy, and also in shorter time. Accordingly, the breakage, etc. of chip 23 and substrate 24 that may be caused by applying too much pressure and/or ultrasonic vibration energy to chip 23 and substrate 24 when the device is formed, can be prevented, and a precise device may be provided.

Also, the holding mechanism to be composed on holding means 40 and on stage 10 to hold chip 23 and substrate 24 does not need to be a holding mechanism with vacuum-suction holding, but rather it is acceptable to use a holding mechanism with an electrostatic chuck, a mechanical chuck mechanism, a magnetic-force holding, etc., which are well known as holding mechanisms.

For example, if holding means 40 and stage 10 are equipped with an electrostatic chuck means and composed such that suction-hold chip 23 and substrate 24, chip 23 can be held in a vacuum, and chip 23 and substrate 24 can be bonded in a vacuum, thus adhesions of impurities such as organic substances and oxide film are prevented, and it is possible to satisfactorily bond chip 23 and substrate 24.

Also, although, as described in the first embodiment, stage 10 is composed of a position control mechanism toward horizontal direction, and head section 26 is composed of a vertical drive mechanism, the position control mechanism in the horizontal direction and the vertical drive mechanism may be combined with stage 10 and head section 26, and/or they may be composed to overlap together.

Moreover, in the first embodiment described above, head section 26 and stage 10 are placed in an upper and lower direction (arrow Z direction as shown in FIG. 1), and it is composed that the objects, chip 23 and substrate 24, are placed facing each other vertically and bonded, but the direction of the placement is not limited to this one. It may be composed to place objects facing each other at right or left, almost perpendicular to the vertical direction described above. Also, it is acceptable to bond more than three objects placing them facing each other.

Also, in the first embodiment described above, a method of torque control of vertical drive motor 1 as a pressing means is described, but the method may be a pressing means utilizing fluid pressure applied by an air cylinder.

Also, the objects may be materials other than semiconductors, such as a substrate that is made of resin, a film substrate, or a chip that is made by dicing these substrates. Also, the objects may be any material that can be bonded by transferring ultrasonic vibration, for example, on wafers and/or chips, etc. that are made of oxides, etc. that include metals like Si, $SiO_2$, glass, ion-oxide lithium, single crystal oxide (LT), ceramic type, melting metal bumps and/or wiring patterns are composed, and they can be bonded each other.

Also, the materials that compose melting metal bumps are not limited to lead-tin solder, but rather any other metal and/or non-metal substances can be bonded by applying ultrasonic vibration.

Also, regarding the configuration of an object, any configuration, such as a substrate, a wafer, or a chip being diced of a substrate and/or a wafer, is acceptable. Also, regarding the type of melting metal bumps, they may be multiple bumps that are independent, or connected lines that surround a certain area of the objects, allowing the area possible to be closed. Also, it may be not a bonding of melting metal bumps to each other, but rather it may be a bonding of entire surfaces of certain areas of the objects each other.

Also, in the embodiment described above, the most distinctive feature is that, traditionally, materials that have been used to control vibrations of a vibrating body itself by absorbing and/or diffusing vibrations of the vibrating body were employed as supporting member to support a resonator, which is a vibrating body, without obstructing resonator's vibration. This idea of technology is completely different technical idea from the traditional technical idea that the above-described member is used to control vibration of a vibrating body itself, and the inventor found the idea by himself for the first time after various tests, and it is the first conclusion obtained by the inventor. With this idea, if the supporting member support a resonator by contacting the resonator, the resonator can be vibrated consistently without deviation even if any portion of the resonator is supported by the supporting member.

The present invention can be applied to a support device for a resonator that resonates with an ultrasonic vibration of a transducer.

The invention claimed is:

1. A support device for a resonator, comprising:
    a resonator having a peripheral surface including a portion-to-be-supported, the resonator resonating with an ultrasonic vibration generated by a transducer; and
    a supporting member supporting the resonator by engaging with the portion-to-be-supported; and
    wherein the supporting member serves to prevent deviation from a natural vibration frequency of the resonator by being formed, at all locations where any portion of the supporting member contacts with the resonator, with a substance having a logarithmic decrement greater than 0.1 but less than 1.0.

2. A support device for a resonator according to claim 1, further comprising:
    a stage arranged below the resonator and used for placing an object to which an ultrasonic vibration is applied, wherein
    the stage includes a holding member for controlling vibration transfer that is made of a substance having a logarithmic decrement greater than 0.1 but less than 1.0 at least on a surface on which the object is placed.

3. A support device for a resonator according to claim 1, further comprising:
    a stage arranged below the resonator and used for placing an object to which an ultrasonic vibration is applied, wherein
    the stage includes a holding member for controlling vibration transfer that is made of a substance having a sound propagation speed of more than 5900 m/s at least on a surface on which the object is placed.

4. A support device for a resonator according to claim 1, wherein said supporting member portion substance also has a sound propagation speed of more than 5900 m/s.

5. A support device for a resonator according to claim 1, wherein said substance comprises a manganese alloy including copper.

6. A support device for a resonator according to claim 1, wherein said substance comprises a manganese alloy including copper, nickel and iron.

7. A support device for a resonator according to claim 1, wherein the supporting member supports the resonator by clamping the portion-to-be-supported.

8. A support device for a resonator, comprising:
    a resonator having a peripheral surface including portions-to-be-supported, the resonator resonating with an ultrasonic vibration generated by a transducer; and
    a plurality of supporting members supporting the resonator at multiple locations by engaging with the portions-to-be-supported; and
    wherein the supporting members serve to prevent deviation from a natural vibration frequency of the resonator, regardless of whether the plurality of supporting members are located at minimum vibration amplitude points of vibrations at said natural frequency, by being formed, at all locations where any portion of any of the supporting members contact with the resonator, with a substance having a logarithmic decrement greater than 0.1 but less than 1.0.

9. A support device for a resonator according to claim 8, wherein said substance comprises a manganese alloy including copper.

10. A support device for a resonator according to claim 8, wherein said substance comprises a manganese alloy including copper, nickel and iron.

11. A support device for a resonator according to claim 8, wherein the supporting member supports the resonator by clamping the portions-to-be-supported.

12. A support device for a resonator, comprising:
a resonator having a peripheral surface including a portion-to-be-supported, the resonator resonating with an ultrasonic vibration generated by a transducer; and
a supporting member supporting the resonator by engaging with the portion-to-be-supported; and
wherein the supporting member has a first configuration in which the resonator is secured by the supporting member and a second configuration in which the resonator may rotate relative to the supporting member;
wherein the supporting member serves to prevent deviation from a natural vibration frequency of the resonator by being formed, at all locations where any portion of the supporting member contacts with the resonator, with a substance having a logarithmic decrement greater than 0.1 but less than 1.0; and
wherein the supporting member supports the resonator by clamping the portion-to-be-supported.

13. A support device for a resonator, comprising:
a resonator having a peripheral surface including a portions-to-be-supported, the resonator resonating with an ultrasonic vibration generated by a transducer; and
a plurality of supporting members, supporting the resonator at multiple locations by engaging with the portions-to-be-supported; and
wherein the plurality of supporting members have a first configuration in which the resonator is secured by the supporting members and a second configuration in which the resonator may rotate relative to the supporting members;
wherein the plurality of supporting members serve to prevent deviation from a natural vibration frequency of the resonator, regardless of whether the plurality of supporting members are located at minimum vibration amplitude points of vibrations at said natural frequency, by being formed, at all locations where any portion of any of the supporting members contact with the resonator, with a substance having a logarithmic decrement greater than 0.1 but less than 1.0; and
wherein the supporting members support the resonator by clamping the portions-to-be-supported.

14. The support device of claim 12, wherein the transducer is connected to the resonator at a location with a center axis of the resonator, and wherein said portion-to-be-supported comprises a first portion-to-be-supported encompassing a first minimum vibration amplitude point of the resonator, and a second portion-to-be-supported encompassing a second minimum vibration amplitude point of the resonator.

15. The support device of claim 12, wherein said portion-to-be-supported comprises a convex-shaped portion of the peripheral surface of the resonator.

16. The support device of claim 12, wherein said portion-to-be-supported comprises a first portion-to-be-supported and a second portion-to-be-supported, each one of the first portion-to-be-supported and second portion-to-be-supported having a smaller cross-sectional area than a portion of the resonator not contacted by the supporting member.

17. The support device of claim 16, wherein each one of the first portion-to-be-supported and second portion-to-be-supported has a polygon-shaped cross-sectional area.

18. The support device of claim 1, wherein the supporting member comprises a base plate, a first clamp, and a second clamp, and wherein said portion-to-be-supported comprises a first portion-to-be-supported and a second portion-to-be-supported, said first clamp in contact with said first portion-to-be-supported, and said second clamp in contact with said second portion-to-be-supported.

19. The support device of claim 18, in which the supporting member further comprises a first bolt operable with the first clamp and a second bolt operable with the second clamp.

20. The support device of claim 13, wherein each one of the plurality of supporting members comprises a clamp and a bolt, said clamp in contact with a corresponding one of the plurality of portions-to-be-supported, said bolt operable with the clamp to secure the resonator, and wherein said plurality of supporting members are arranged so that loosened bolts of said plurality of supporting members allow the resonator to be rotated about a resonator center axis.

21. The support device of claim 12, wherein the resonator has a center axis, and wherein while the supporting member is in the second configuration the resonator may rotate, relative to the supporting member, about the center axis, said supporting member holding the resonator more loosely in the second configuration compared to the first configuration.

22. The support device of claim 13, wherein the resonator has a center axis, and wherein while the plurality of supporting members are in the second configuration the resonator may rotate, relative to the supporting members, about the center axis, said supporting members holding the resonator more loosely in the second configuration compared to the first configuration.

23. A support device for a resonator, comprising:
a resonator having a peripheral surface including at least one portion-to-be-supported and another portion distinct from the at least one portion-to-be-supported;
a transducer in physical communication with the resonator at said another portion, the transducer imparting ultrasonic vibration to said another portion to vibrate the resonator; and
a supporting member supporting the resonator by engaging with the at least one portion-to-be-supported; and
wherein the supporting member serves to prevent deviation from a natural vibration frequency of the resonator by being formed, at all locations where any portion of the supporting member contacts with the resonator, with a substance having a logarithmic decrement greater than 0.01 but less than 1.0, said at least one portion-to-be-supported comprising said all locations, and wherein said substance comprises a manganese alloy including copper.

24. The support device of claim 23, wherein said manganese alloy further includes nickel and iron.

* * * * *